(12) United States Patent
Lim et al.

(10) Patent No.: US 12,082,412 B2
(45) Date of Patent: Sep. 3, 2024

(54) THREE-DIMENSIONAL SEMICONDUCTOR MEMORY DEVICE WITH VERTICAL STRUCTURES BETWEEN CONTACT PLUGS

(71) Applicant: SAMSUNG ELECTRONICS CO., LTD., Suwon-si (KR)

(72) Inventors: Ju-Young Lim, Seoul (KR); Jongsoo Kim, Seoul (KR); Jesuk Moon, Hwaseong-si (KR); Dongwoo Kim, Seoul (KR); Sunil Shim, Seoul (KR); Wonseok Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 230 days.

(21) Appl. No.: 17/154,159

(22) Filed: Jan. 21, 2021

(65) Prior Publication Data

US 2021/0399008 A1    Dec. 23, 2021

(30) Foreign Application Priority Data

Jun. 19, 2020    (KR) .................. 10-2020-0074797

(51) Int. Cl.
*H10B 43/27*    (2023.01)
*H01L 23/522*   (2006.01)
(Continued)

(52) U.S. Cl.
CPC ......... *H10B 43/27* (2023.02); *H01L 23/5226* (2013.01); *H10B 41/10* (2023.02);
(Continued)

(58) Field of Classification Search
CPC .......... H01L 23/5226; H01L 27/11519; H01L 27/11526; H01L 27/11556;
(Continued)

(56) References Cited

U.S. PATENT DOCUMENTS 9,870,991 B1 *  1/2018  Kim .................. H10B 43/27
10,553,610 B2   2/2020  Lee et al.
(Continued)

FOREIGN PATENT DOCUMENTS

CN    109496356 A    3/2019
CN    110600473 A    12/2019
(Continued)

*Primary Examiner* — Lex H Malsawma
*Assistant Examiner* — Sean Ayers Winters
(74) *Attorney, Agent, or Firm* — Fish & Richardson P.C.

(57) ABSTRACT

A three-dimensional semiconductor memory device includes a substrate including a cell array region and a connection region, an electrode structure including electrodes vertically stacked on the substrate, the electrodes including pad portions on the connection region, respectively, and the pad portions of the electrodes being stacked in a staircase structure, first vertical structures penetrating the electrode structure on the cell array region, and second vertical structures penetrating the electrode structure on the connection region, each of the second vertical structures including first parts spaced apart from each other in a first direction, and at least one second part connecting the first parts to each other, the at least one second part penetrating sidewalls of the pad portions, respectively.

20 Claims, 20 Drawing Sheets

(51) Int. Cl.
  *H10B 41/10* (2023.01)
  *H10B 41/27* (2023.01)
  *H10B 41/40* (2023.01)
  *H10B 43/10* (2023.01)
  *H10B 43/40* (2023.01)

(52) U.S. Cl.
  CPC ............. *H10B 41/27* (2023.02); *H10B 41/40* (2023.02); *H10B 43/10* (2023.02); *H10B 43/40* (2023.02)

(58) Field of Classification Search
  CPC ......... H01L 27/11565; H01L 27/11573; H01L 27/11582
  See application file for complete search history.

(56) References Cited

U.S. PATENT DOCUMENTS

| | | | |
|---|---|---|---|
| 10,566,345 | B2 | 2/2020 | Kanamori et al. |
| 11,398,491 | B2 | 7/2022 | Baek |
| 2009/0011539 | A1* | 1/2009 | Jeng ........................ H01L 22/34 438/107 |
| 2015/0194435 | A1 | 7/2015 | Lee |
| 2016/0293622 | A1* | 10/2016 | Jeong ..................... H10B 43/50 |
| 2017/0200676 | A1* | 7/2017 | Jeong ..................... H10B 41/35 |
| 2018/0254271 | A1* | 9/2018 | Woo ................... H01L 21/76895 |
| 2019/0035806 | A1 | 1/2019 | Jung et al. |
| 2019/0157283 | A1* | 5/2019 | Jung ..................... H10B 43/27 |
| 2019/0157291 | A1 | 5/2019 | Kam et al. |
| 2019/0181226 | A1 | 6/2019 | Choi et al. |
| 2019/0304993 | A1* | 10/2019 | Lee ........................ H10B 43/10 |
| 2020/0058667 | A1 | 2/2020 | Baek |
| 2020/0119031 | A1 | 4/2020 | Shen et al. |
| 2020/0135749 | A1* | 4/2020 | Hwang ................. H01L 23/535 |
| 2020/0194373 | A1* | 6/2020 | Baek ..................... H10B 43/10 |

FOREIGN PATENT DOCUMENTS

| | | |
|---|---|---|
| KR | 10-2015-0081393 A | 7/2015 |
| KR | 10-2018-0026211 | 3/2018 |
| KR | 10-2019-0051651 | 5/2019 |
| KR | 10-2020-0020332 | 2/2020 |

\* cited by examiner

THREE-DIMENSIONAL SEMICONDUCTOR MEMORY DEVICE WITH VERTICAL STRUCTURES BETWEEN CONTACT PLUGS

CROSS-REFERENCE TO RELATED APPLICATION

Korean Patent Application No. 10-2020-0074797, filed on Jun. 19, 2020, in the Korean Intellectual Property Office, and entitled: "Three-Dimensional Semiconductor Memory Device," is incorporated by reference herein in its entirety.

BACKGROUND

1. Field

Embodiments relate to a three-dimensional semiconductor memory device, and more particularly, to a three-dimensional semiconductor memory device with improved reliability and increased integration.

2. Description of the Related Art

Semiconductor devices have been highly integrated to meet high performance and low manufacturing cost which are required by customers. Because integration of the semiconductor devices is an important factor in determining product price, high integration is increasingly requested. Integration of typical two-dimensional or planar semiconductor devices is primarily determined by the area occupied by a unit memory cell, as it is greatly influenced by the level of technology for forming fine patterns. However, the extremely expensive processing equipment needed to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

According to some example embodiments, a three-dimensional semiconductor memory device may include a substrate including a cell array region and a connection region, an electrode structure including a plurality of electrodes vertically stacked on the substrate, each of the electrodes including a pad portion on the connection region, the pad portions being stacked in a staircase structure, a plurality of first vertical structures penetrating the electrode structure on the cell array region, and a plurality of second vertical structures penetrating the electrode structure on the connection region. Each of the second vertical structures may include a plurality of first parts spaced apart from each other in a first direction, and a plurality of second parts spaced apart from each other in a second direction intersecting the first direction, the second parts connecting the first parts to each other. The first and second directions may be parallel to a top surface of the substrate.

According to some example embodiments, a three-dimensional semiconductor memory device may include a substrate including a cell array region and a connection region, an electrode structure including a plurality of electrodes vertically stacked on the substrate, each of the electrodes including a pad portion on the connection region, the pad portions being stacked in a staircase structure, a plurality of first vertical structures penetrating the electrode structure on the cell array region, and a plurality of second vertical structures penetrating the electrode structure on the connection region. Each of the second vertical structures may include a plurality of first parts spaced apart from each other in a first direction, and at least one second part connecting the first parts to each other. The second parts of the second vertical structures may correspondingly penetrate sidewalls of the pad portions.

According to some example embodiments, a three-dimensional semiconductor memory device may include a peripheral circuit structure including a plurality of peripheral circuits integrated on a semiconductor substrate, a horizontal layer on the peripheral structure, the horizontal layer including a cell array region and a connection region, an electrode structure including a plurality of electrodes vertically stacked on the horizontal layer, each of the electrodes including a pad portion on the connection region, the pad portions of the electrodes being stacked in a staircase structure, a plurality of first vertical structures penetrating the electrode structure on the cell array region, a plurality of second vertical structures penetrating the electrode structure on the connection region, a plurality of cell contact plugs correspondingly coupled to the pad portions of the electrodes, and a connection structure connecting the electrode structure to the peripheral circuit structure, the connection structure including a through dielectric pattern penetrating the electrode structure on the connection region and a plurality of through plugs in the through dielectric pattern, the through plugs being connected to the peripheral circuit structure, Each of the second vertical structures may include a plurality of first parts between the cell contact plugs adjacent to each other in the first direction, the first parts being spaced apart from each other in the first direction, and a second part connecting the first parts to each other.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
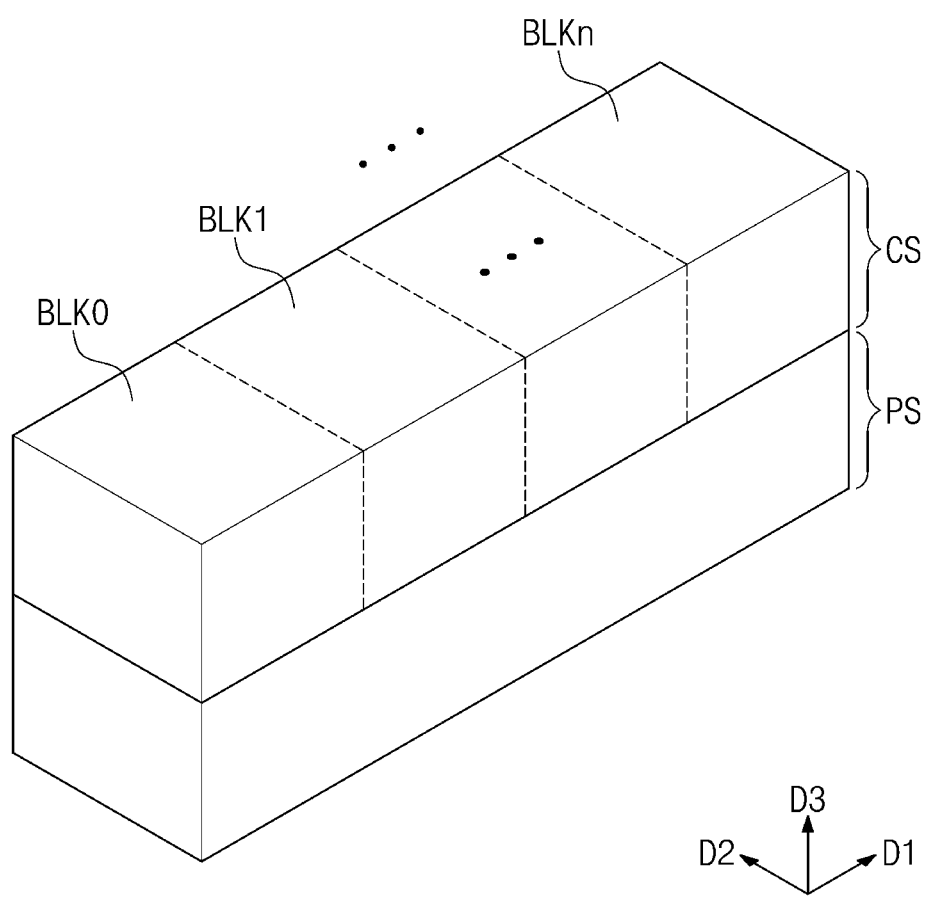
FIG. 1 illustrates a simplified perspective view showing a three-dimensional semiconductor memory device according to some example embodiments.

FIG. 1 illustrates a simplified perspective view showing a three-dimensional semiconductor memory device according to some example embodiments.

Referring to FIG. 1, a three-dimensional semiconductor memory device according to some example embodiments may include a peripheral circuit structure PS, a cell array structure CS on the peripheral circuit structure PS, and a connection structure that connects the cell array structure CS to the peripheral circuit structure PS. The peripheral circuit structure PS may include row and column decoders, a page buffer, and control circuits.

When viewed in a plan view, the cell array structure CS may overlap the peripheral circuit structure PS. The cell array structure CS may include a plurality of memory blocks BLK0 to BLKn each of which is a data erasure unit. Each of the memory blocks BLK0 to BLKn may include a memory cell array having a three-dimensional structure (or a vertical structure).

Figure 2:
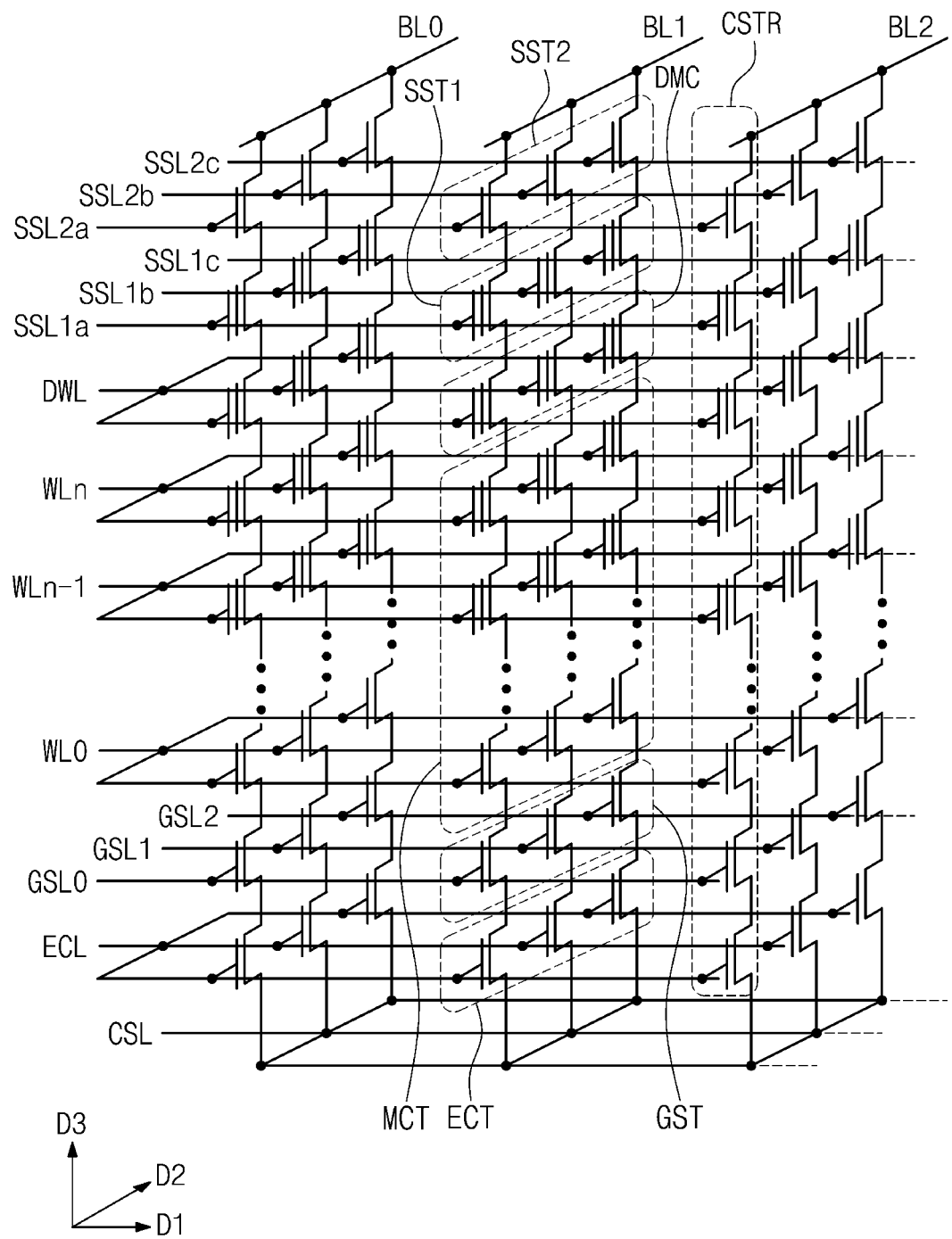
FIG. 2 illustrates a circuit diagram showing a cell array of a three-dimensional semiconductor memory device according to some example embodiments.

FIG. 2 illustrates a circuit diagram showing a cell array of a three-dimensional semiconductor memory device according to some example embodiments.

Referring to FIG. 2, cell strings CSTR may be two-dimensionally arranged along first and second directions D1 and D2, and may extend along a third direction D3. A plurality of cell strings CSTR may be connected in parallel to each of bit lines BL0 to BL2. The plurality of cell strings CSTR may be connected in common to a common source line CSL.

Each of the cell strings CSTR may include first and second string select transistors SST1 and SST2 connected in series, memory cell transistors MCT connected in series, a ground select transistor GST, and an erase control transistor ECT. Each of the memory cell transistors MCT may include a data storage element. Each of the cell strings CSTR may further include dummy cells DMC connected between the first string select transistor SST1 and the memory cell transistor MCT and between the ground select transistor GST and the memory cell transistor MCT.

The first string select transistor SST1 may be controlled by one of first string select lines SSL1a, SSL1b, and SSL1c, and the second string select transistor SST2 may be controlled by one of second string select lines SSL2a, SSL2b, and SSL2c. The memory cell transistors MCT may be controlled by corresponding word lines WL0 to WLn, and the dummy cells DMC may be controlled by corresponding dummy word lines DWL. The ground select transistor GST may be controlled by a ground select line GSL0, GSL1, or GSL2, and the erase control transistor ECT may be controlled by an erase control line ECL.

Figure 3:
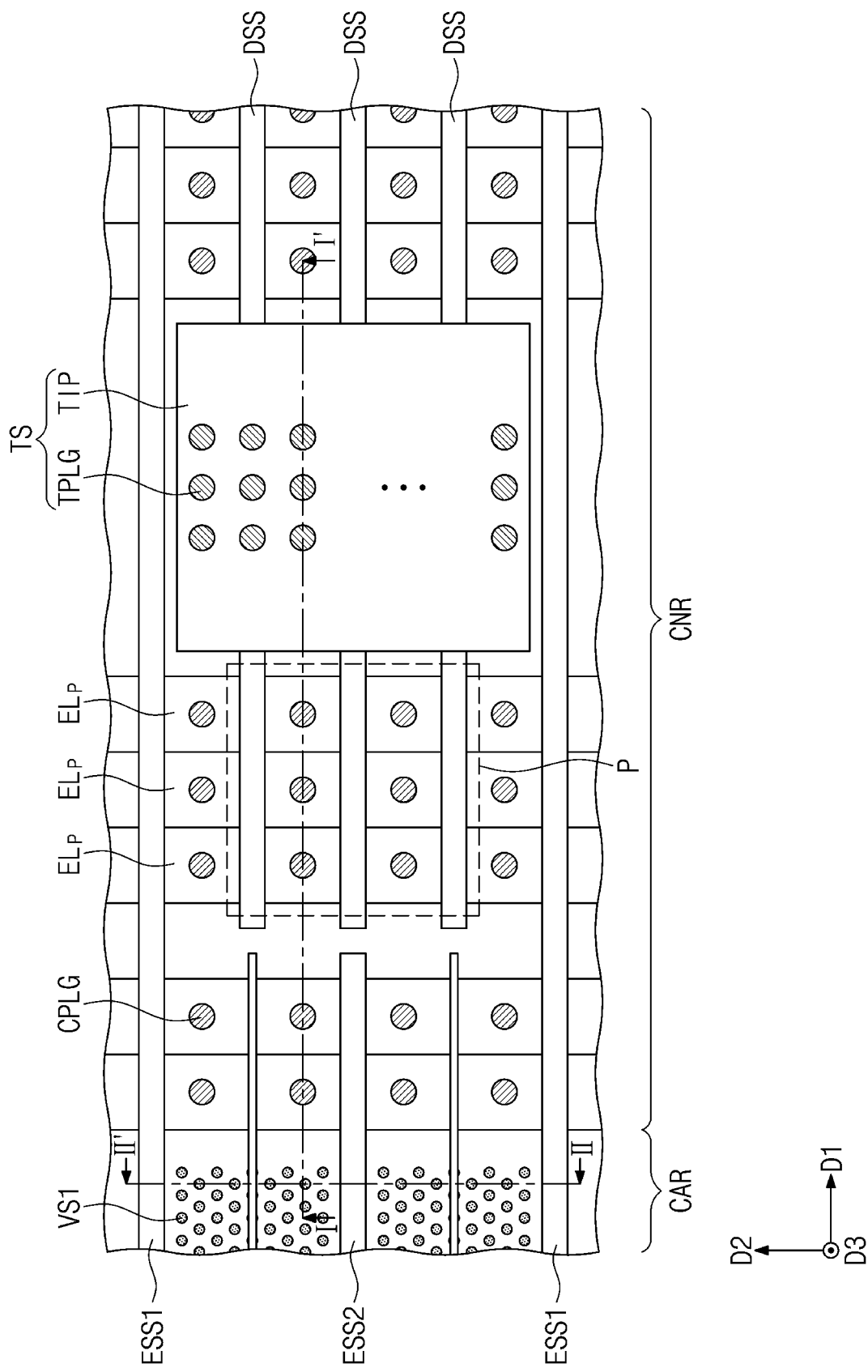
FIG. 3 illustrates a plan view showing a three-dimensional semiconductor memory device according to some example embodiments.
Figure 4A:
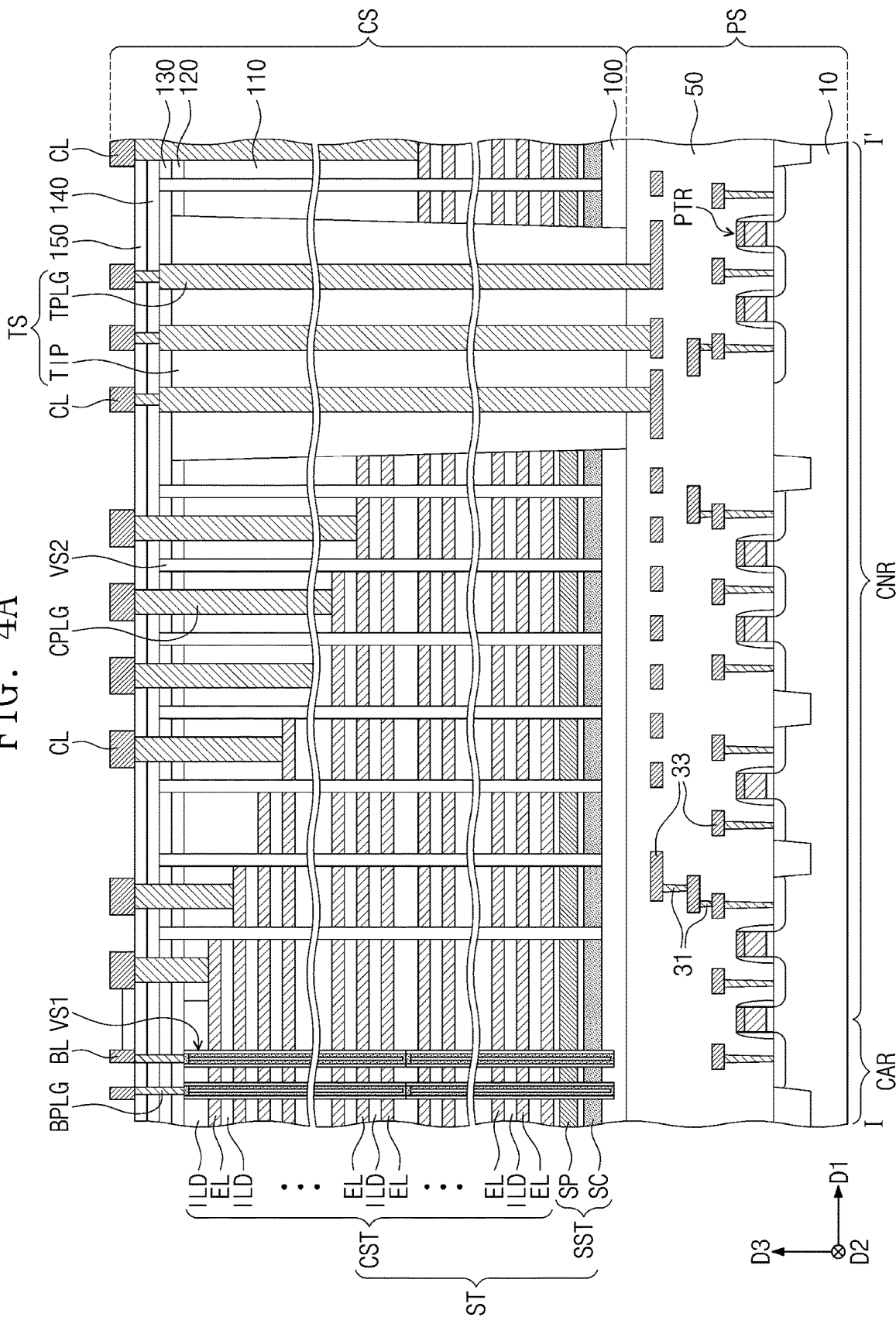
FIG. 4A illustrates a cross-sectional view taken along line I-I' of FIG. 3, showing a three-dimensional semiconductor memory device according to some example embodiments.

FIG. 3 illustrates a plan view showing a three-dimensional semiconductor memory device according to some example embodiments. FIG. 4A illustrates a cross-sectional view along line I-I' of FIG. 3, FIG. 4B illustrates a cross-sectional view along line II-II' of FIG. 3, and FIG. 5 illustrates an enlarged view of section A in FIG. 4B.

Figure 4B:
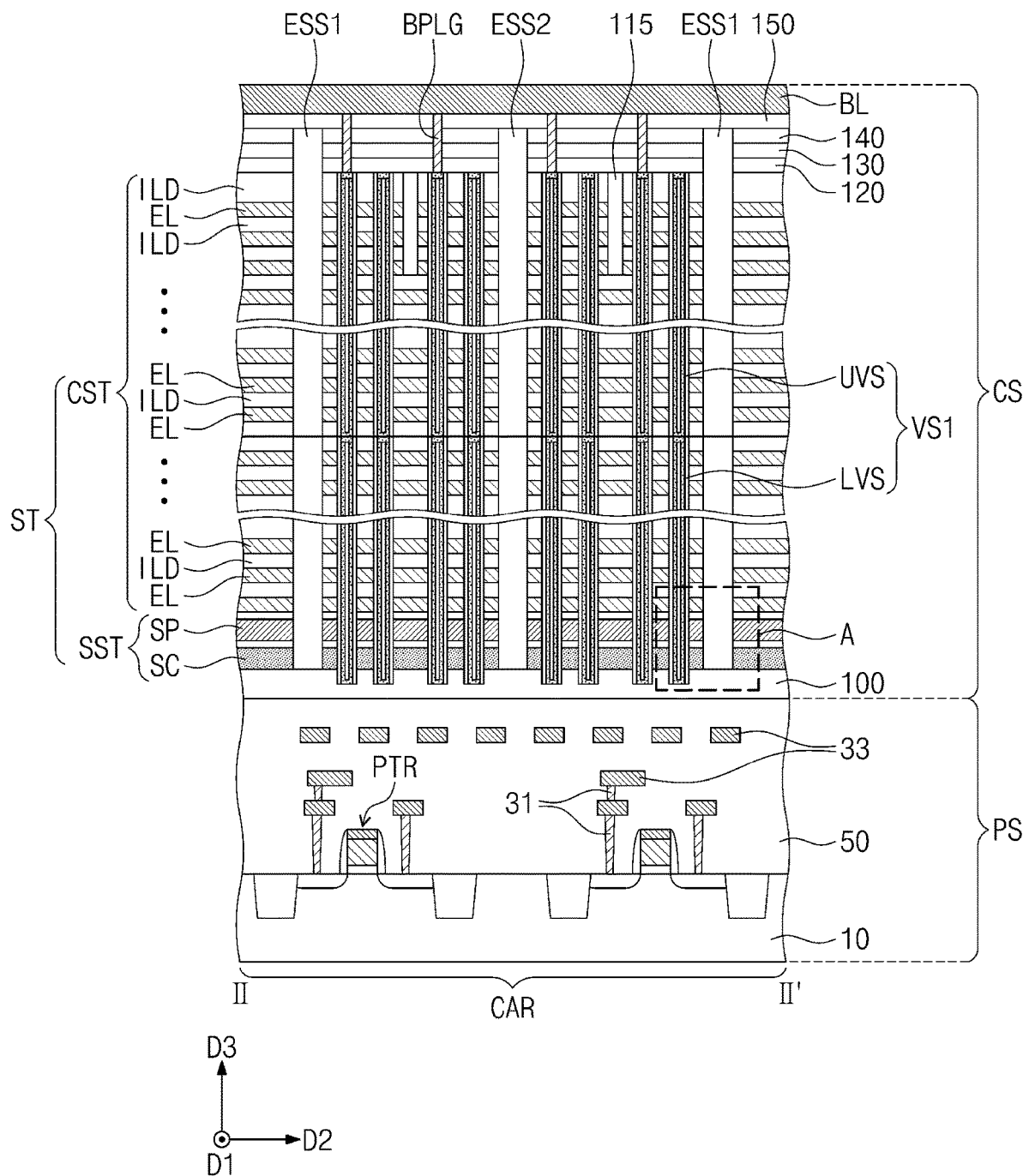
FIG. 4B illustrates a cross-sectional view taken along line II-II' of FIG. 3, showing a three-dimensional semiconductor memory device according to some example embodiments.
Figure 5:
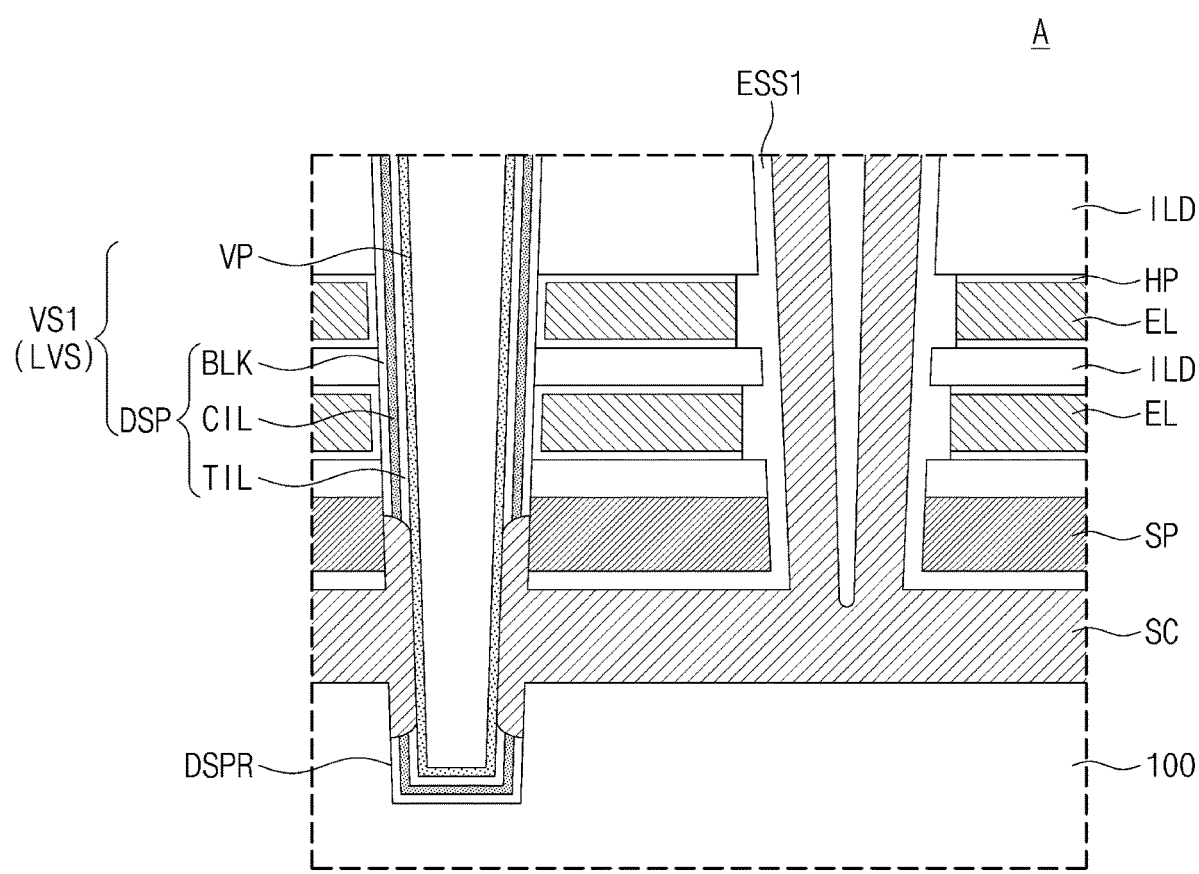
FIG. 5 illustrates an enlarged view of section A of FIG. 4B.

Referring to FIGS. 3, 4A, and 4B, a three-dimensional semiconductor memory device according to some example embodiments may include the peripheral circuit structure PS and the cell array structure CS on the peripheral circuit structure PS discussed previously with reference to FIG. 1.

The peripheral circuit structure PS may include peripheral circuits PTR integrated on an entire surface of a semiconductor substrate 10 and a lower buried dielectric layer 50 that covers the peripheral circuits PTR. The semiconductor substrate 10 may be, e.g., a silicon substrate. The peripheral circuits PTR may be, e.g., row and column decoders, a page buffer, a control circuit, and a control circuit. For example, the peripheral circuits PTR may include NMOS and PMOS transistors. Peripheral circuit lines 33 may be electrically connected through peripheral contact plugs 31 to the peripheral circuits PTR.

The lower buried dielectric layer 50 may be provided on the entire surface of the semiconductor substrate 10. On the semiconductor substrate 10, the lower buried dielectric layer 50 may cover the peripheral circuits PTR, the peripheral contact plugs 31, and the peripheral circuit lines 33. The lower buried dielectric layer 50 may include a plurality of stacked dielectric layers.

The cell array structure CS may include a horizontal layer 100, an electrode structure ST, first and second vertical structures VS1 and VS2, and a through line structure TS.

The horizontal layer 100 may include a cell array region CAR and a connection region CNR adjacent to the cell array region CAR, e.g., in the first direction D1. The horizontal layer 100 may be disposed on a top surface of the lower buried dielectric layer 50. The horizontal layer 100 may be formed of, e.g., a semiconductor material, a dielectric material, or a conductive material. The horizontal layer 100 may include a semiconductor doped with impurities having a first conductivity type (e.g., n-type) and/or an intrinsic semiconductor doped with no impurities.

The electrode structure ST may include a source structure SST on the horizontal layer 100 and a cell electrode structure CST on the source structure SST.

The source structure SST may include a source conductive pattern SC and a support conductive pattern SP on the source conductive pattern SC. A dielectric layer may be interposed between the source conductive pattern SC and the support conductive pattern SP. The source structure SST may be parallel to a top surface of the horizontal layer 100, and may extend in the first direction D1 parallel to the cell electrode structure CST on the cell array region CAR.

The source conductive pattern SC may include a semiconductor material doped with first conductivity type impurities (e.g., phosphorus (P) or arsenic (As)). For example, the source conductive pattern SC may be formed of a semiconductor layer doped with n-type impurities. On the cell array region CAR, the source conductive pattern SC may be in contact with portions of vertical semiconductor patterns VP. This will be further discussed in detail with reference to FIG. 5.

The support conductive pattern SP may cover a top surface of the source conductive pattern SC, and may include a semiconductor doped with impurities having a first conductivity type (e.g., n-type) and/or an intrinsic semiconductor doped with no impurities.

The cell electrode structure CST on the horizontal layer 100 may extend from the cell array region CAR toward the connection region CNR. The cell electrode structure CST may include electrodes EL and dielectric layers ILD that are alternately stacked along a third direction D3 (or a vertical direction) perpendicular to the first and second directions D1 and D2. The electrodes EL may include, for example, at least one of doped semiconductors (e.g., doped silicon), metals (e.g., tungsten, copper, or aluminum), conductive metal nitrides (e.g., titanium nitride, tantalum, or nitride), and transition metals (e.g., titanium, or tantalum). The dielectric layers ILD may include, e.g., a silicon oxide layer or a low-k dielectric layer. According to some example embodiments, a three-dimensional semiconductor memory device may be a vertical NAND Flash memory device, and in this case, the electrodes EL of the electrode structure ST may be used as the erasure control line ECL, the ground select lines CSL0 to CSL2, the word lines WL0 to WLn and DWL, and the string select lines SSL1a to SSL1c and SSL2a to SSL2c discussed previously with reference to FIG. 2.

The cell electrode structure CST or the electrode structure ST may have a staircase structure on the connection region CNR, e.g., the electrodes EL may have increasing lengths along the first direction D1 as a distance along the third direction D3 from the semiconductor substrate 10 decreases. For example, the cell electrode structure CST may have a height that decreases, e.g., along the third direction D3, with increasing distance from the cell array region CAR, e.g., along the first direction D1. The electrodes EL may have their sidewalls that are spaced apart at a regular interval from each other along the first direction D1. Each of the electrodes EL may have a pad portion ELp on the connection region CNR, and the pad portions ELp may be horizontally and vertically located at different positions. Dummy separation structures DSS may separate the pad portions ELp of the electrodes EL from each other in the second direction D2.

A separation dielectric pattern 115 may penetrate two or three electrodes EL positioned at a top of the cell electrode structure CST, e.g., along the third direction D3 (FIG. 4B). The separation dielectric pattern 115 may have a linear shape that extends in the first direction D1, and the electrodes EL adjacent thereto may be spaced apart from each other in the second direction D2.

A planarized dielectric layer 110 may cover the staircase-shaped pad portions ELp of the electrode structures ST. The planarized dielectric layer 110 may have a substantially flat top surface. The planarized dielectric layer 110 may include a single dielectric layer or a plurality of stacked dielectric layers. The planarized dielectric layer 110 may be provided thereon with first, second, third, and fourth interlayer dielectric layers 120, 130, 140, and 150.

The horizontal layer 100 may be provided thereon with first and second electrode separation structures ESS1 and ESS2 that penetrate the electrode structure ST. The first electrode separation structures ESS1 may extend along the first direction D1 from the cell array region CAR toward the connection region CNR, and may be spaced apart from each other in the second direction D2 intersecting the first direction D1. The second electrode separation structure ESS2 may penetrate the electrode structure ST on the cell array region CAR. The second electrode separation structure ESS2 may be disposed between the first electrode separation structures ESS1. When viewed in the first direction D1, the second electrode separation structure ESS2 may have a length less than that of the first electrode separation structure ESS1. Alternatively, a plurality of second electrode separation structures ESS2 may be provided between the first electrode separation structures ESS1. Each of the first and second electrode separation structures ESS1 and ESS2 may include a dielectric layer that covers a sidewall of the electrode structure ST.

On the connection region CNR, the dummy separation structures DSS may be spaced apart from the first and second electrode separation structures ESS1 and ESS2, and may penetrate the planarized dielectric layer 110 and the electrode structure ST. The dummy separation structures DSS may extend along the first direction D1.

Cell contact plugs CPLG may be correspondingly coupled to the pad portions ELp of the electrodes EL, while penetrating the planarized dielectric layer 110 and the first, second, third, and fourth interlayer dielectric layers 120, 130, 140, and 150. The cell contact plugs CPLG may have their vertical lengths, e.g., along the third direction D3, that decrease with decreasing distance from the cell array region CAR. The cell contact plugs CPLG may have their top surfaces substantially coplanar with each other. On the connection region CNR, conductive lines CL may be disposed on the fourth interlayer dielectric layer 150 and may be coupled to the cell contact plugs CPLG.

On the connection region CNR, a through line structure TS may vertically penetrate the electrode structure ST and the horizontal layer 100. The through line structure TS may include a through dielectric pattern TIP and through plugs TPLG connected to the peripheral circuit structure PS.

According to some example embodiments, when viewed in a plan view, the through line structure TS may be provided between the first electrode separation structures ESS1. The through line structure TS may partially penetrate the staircase structure of the electrode structure ST.

The through dielectric pattern TIP may extend in the third direction D3 on the lower buried dielectric layer 50. The through dielectric pattern TIP may have a bottom surface in, e.g., direct, contact with the lower buried dielectric layer 50 of the peripheral circuit structure PS, and may cover the sidewalls of the electrode structures ST adjacent to the through dielectric pattern TIP. When viewed in a plan view, the through dielectric pattern TIP may be surrounded by the electrode structure ST, e.g., a perimeter of the through dielectric pattern TIP may be completely surrounded by the electrode structure ST. The through dielectric pattern TIP may have a lower width less than an upper width thereof, e.g., a width of the through dielectric pattern TIP along the first direction D1 may decrease as a distance from the horizontal layer 100 decreases. The through dielectric pattern TIP may be formed of a dielectric material, e.g., a silicon oxide layer or a low-k dielectric layer.

A plurality of through plugs TPLG may penetrate the through dielectric pattern TIP and may have connection with the peripheral circuit lines 33 of the peripheral circuit structure PS. The through plugs TPLG may be connected through the conductive lines CL and the cell contact plugs CPLG to the electrodes EL of the electrode structure ST.

According to some example embodiments, a plurality of first vertical structures VS1 may penetrate the electrode structure ST on the cell array region CAR, and a plurality of second vertical structures VS2 may penetrate the planarized dielectric layer 110 and the electrode structure ST on the connection region CNR.

Each of the first vertical structures VS1 may include a lower vertical structure LVS that penetrates a lower portion of the electrode structure ST, and may also include an upper vertical structure UVS that penetrates an upper portion of the electrode structure ST. Each of the lower and upper vertical structures LVS and UVS may have a width (or diameter) that increases as approaching the upper portion from the lower portion.

Referring to FIG. 5, each of the lower and upper vertical structures LVS and UVS may include a vertical semiconductor pattern VP and a data storage pattern DSP that surrounds a sidewall of the vertical semiconductor pattern VP.

For example, the vertical semiconductor pattern VP may have a macaroni shape or a pipe shape whose bottom end is closed. The vertical semiconductor pattern VP may be shaped like U, and may have an inside filled with a dielectric material. The vertical semiconductor pattern VP may include a semiconductor material, e.g. silicon (Si), germanium (Ge), or a mixture thereof. The vertical semiconductor patterns VP including a semiconductor material may be used as channels of the erase control transistor ECT, the string and ground select transistors SST and GST, and the memory cell transistors MCT discussed with reference to FIG. 2.

The vertical semiconductor pattern VP of each lower vertical structure LVS may have a sidewall whose portion is in contact with the source conductive pattern SC. In each lower vertical structure LVS, the data storage pattern DSP may have a bottom surface at a level that is higher than that of a bottom surface of a lowermost electrode EL and lower than that of a top surface of the source conductive pattern SC.

The data storage pattern DSP may extend in the third direction D3 and may surround the sidewall of the vertical semiconductor pattern VP. The data storage pattern DSP may have a macaroni shape or a pipe shape whose top and bottom ends are opened. The data storage pattern DSP may include a single thin layer or a plurality of thin layers. In some example embodiments, the data storage pattern DSP may include a tunnel dielectric layer TIL, a charge storage layer CIL, and a blocking dielectric layer BLK that are sequentially deposited on the sidewall of the vertical semiconductor pattern VP, which layers TIL, CIL, and BLK constitute a data storage layer of a NAND Flash memory device. For example, the charge storage layer CIL may be a trap dielectric layer, a floating gate electrode, or a dielectric layer including conductive nano-dots. Additionally, the horizontal layer 100 may include therein a dummy data storage pattern DPSP vertically spaced apart from the data storage pattern DSP.

A horizontal dielectric pattern HP may be provided between the data storage pattern DSP and the sidewalls of the electrodes EL. The horizontal dielectric pattern HP may extend from the sidewalls of the electrodes EL onto top and bottom surfaces of the electrodes EL.

Although bit lines are omitted in plan views, referring to FIGS. 4A and 4B, bit lines BL may be disposed on the fourth interlayer dielectric layer 150 on the cell array region CAR and may extend in the second direction D2 while running across the electrode structure ST. The bit lines BL may be electrically connected through bit-line contact plugs BPLG to the first vertical structures VS1.

Referring back to FIG. 4A, the second vertical structures VS2 may penetrate the staircase structure of the electrode structure ST, and the number of the electrodes EL penetrated by the second vertical structures VS2 may decrease as the second vertical structures VS2 become distant from the cell array region CAR.

The second vertical structures VS2 may penetrate the pad portions ELp of the electrodes EL on the connection region CNR. When viewed in a plan view, portions of the second vertical structures VS2 may penetrate sidewalls of the pad portions ELp of the electrodes EL.

The second vertical structures VS2 may include different structure and material from those of the first vertical structures VS1. For example, the second vertical structures VS2 may each be a dielectric pillar formed of a dielectric material. The second vertical structures VS2 may be formed of, e.g., silicon oxide. The dielectric pillar may have a sidewall in contact with the electrodes EL of the electrode structure ST, and may also have a bottom surface in contact with the horizontal layer 100.

In some example embodiments, the second vertical structures VS2 may have their top surfaces at a higher level than that of top surfaces of the first vertical structures VS1. The top surfaces of the second vertical structures VS2 may be located at substantially the same level as that of top surfaces of the through plugs TPLG.

The first interlayer dielectric layer 120 may cover the top surfaces of the first vertical structures VS1, and the third interlayer dielectric layer 140 may cover the top surfaces of the second vertical structures VS2 and the top surfaces of the through plugs TPLG. The second vertical structures VS2 will be further discussed in detail with reference to FIGS. 6 to 19.

Figure 6:
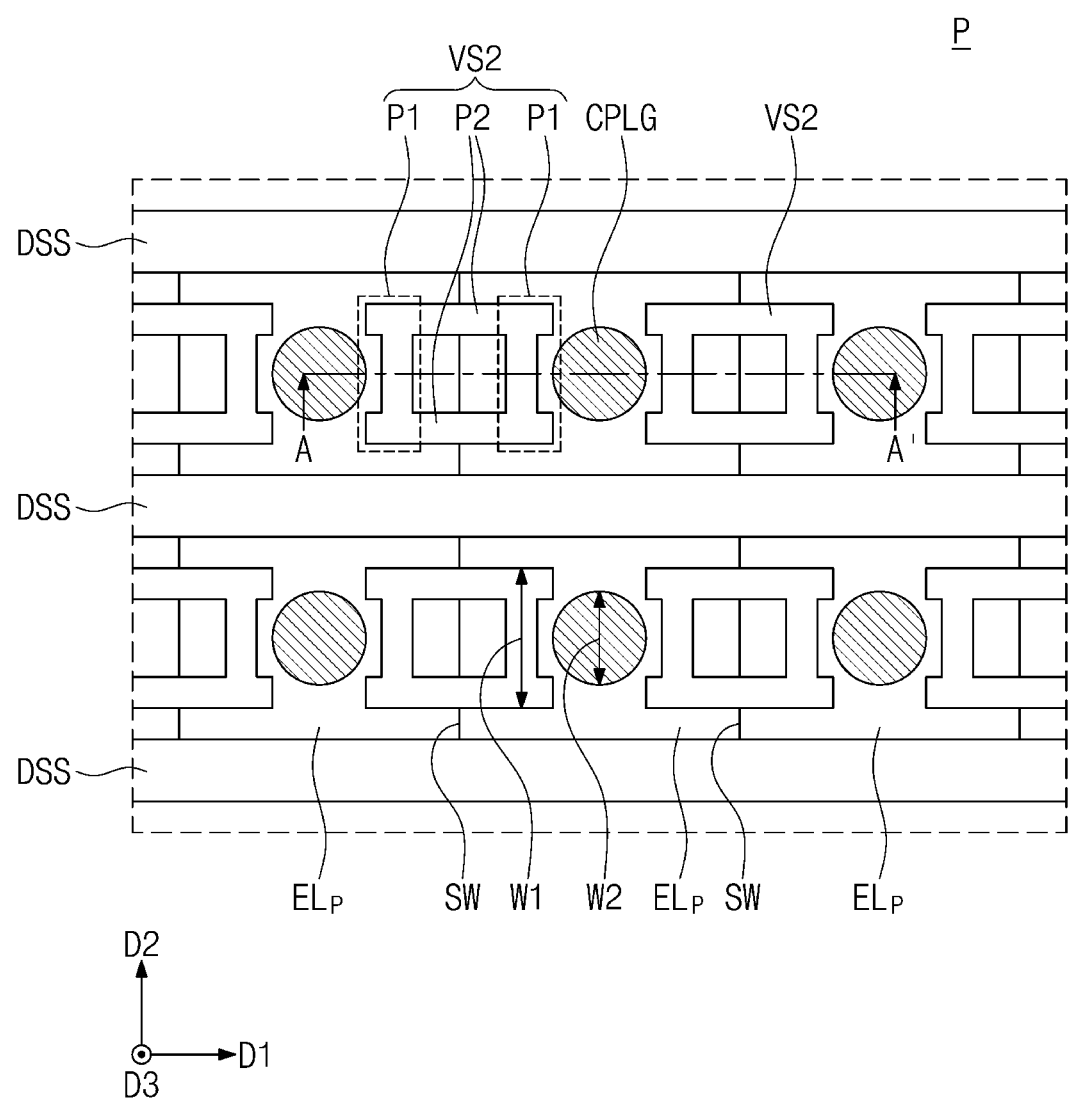
FIG. 6 illustrates an enlarged plan view of section P in FIG. 3, showing a three-dimensional semiconductor memory device according to some example embodiments.
Figure 7:
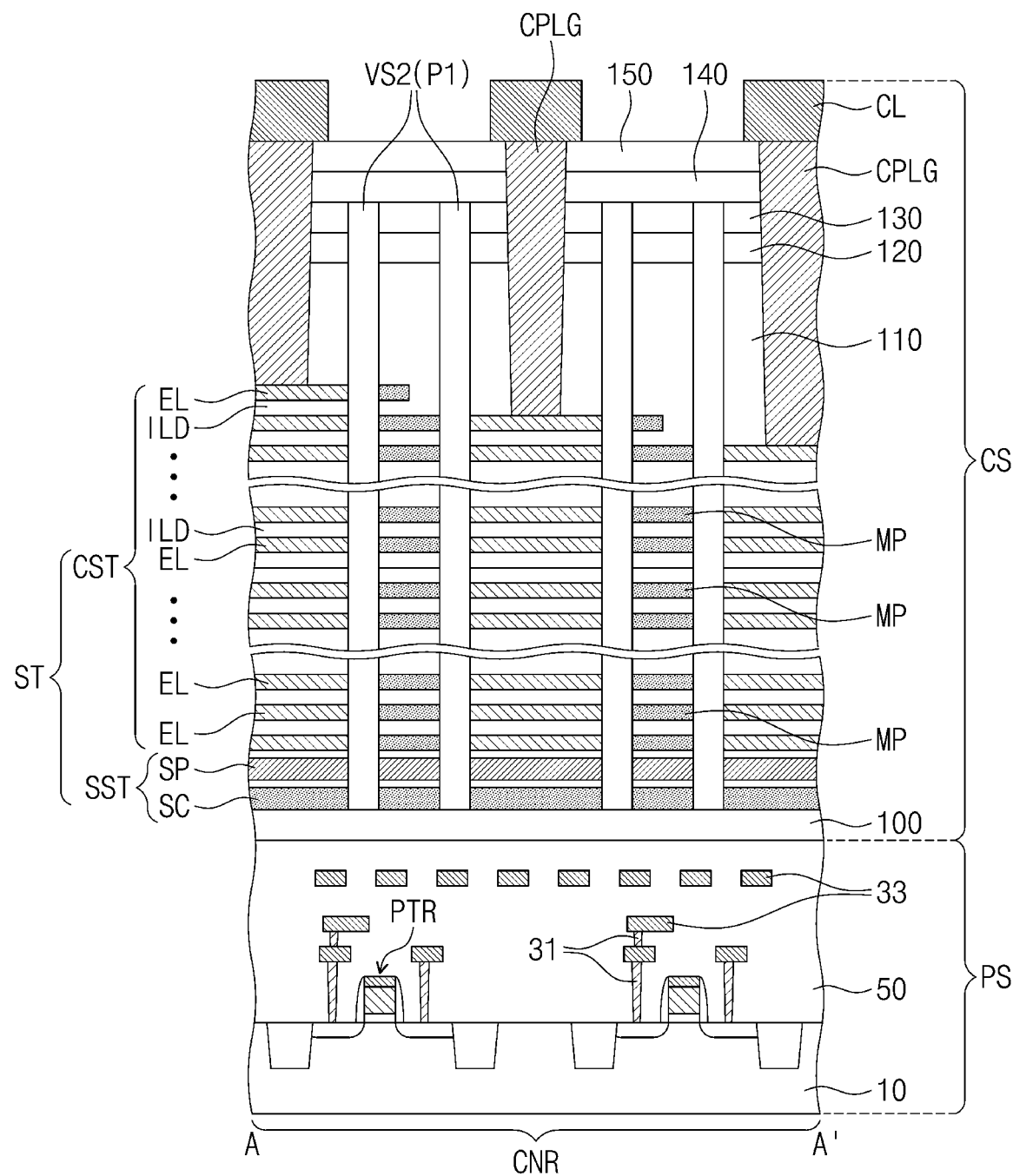
FIGS. 7 to 9 illustrates cross-sectional views taken along line A-A' of FIG. 6, showing a three-dimensional semiconductor memory device according to some example embodiments.
Figure 8:
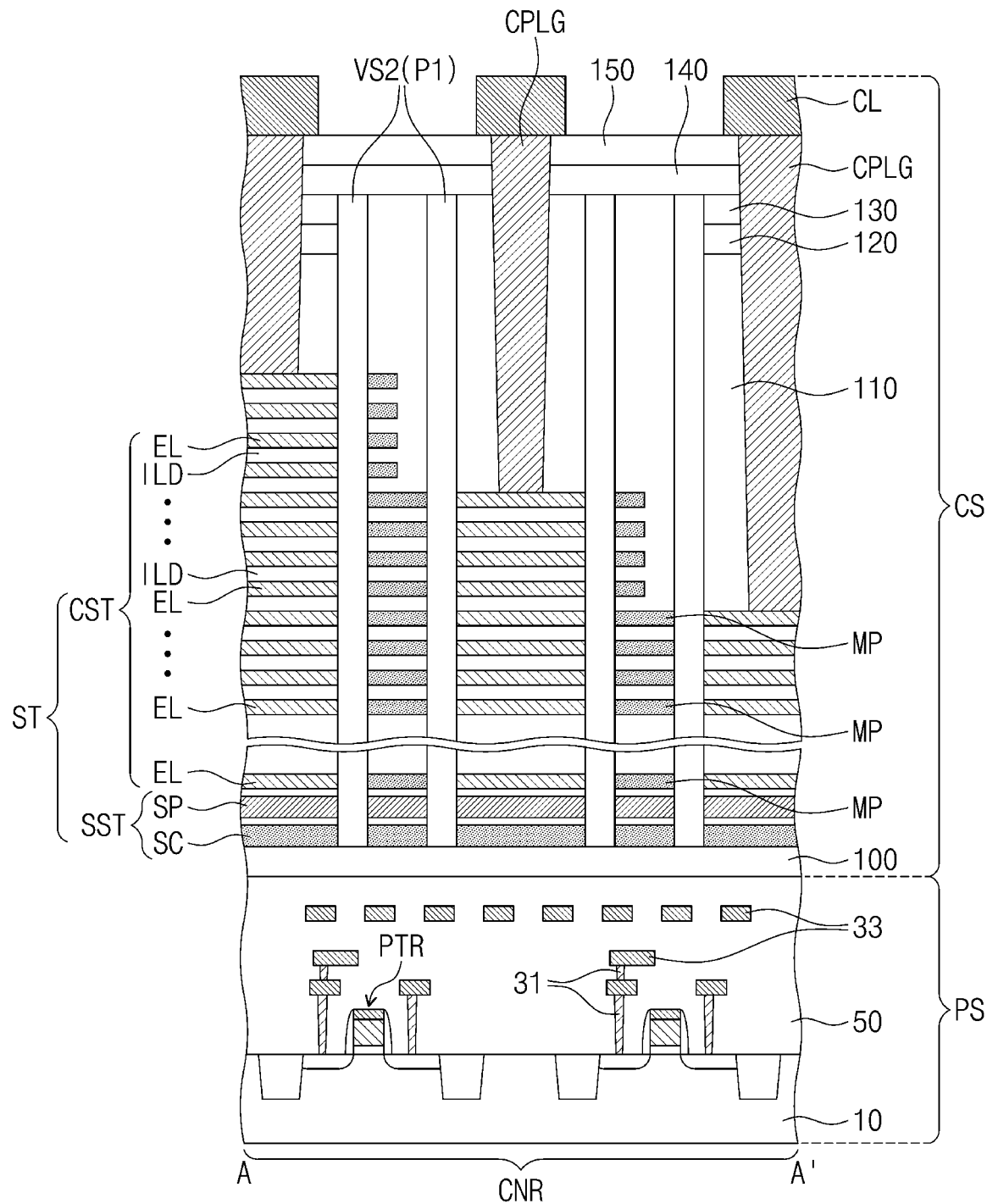
Figure 9:
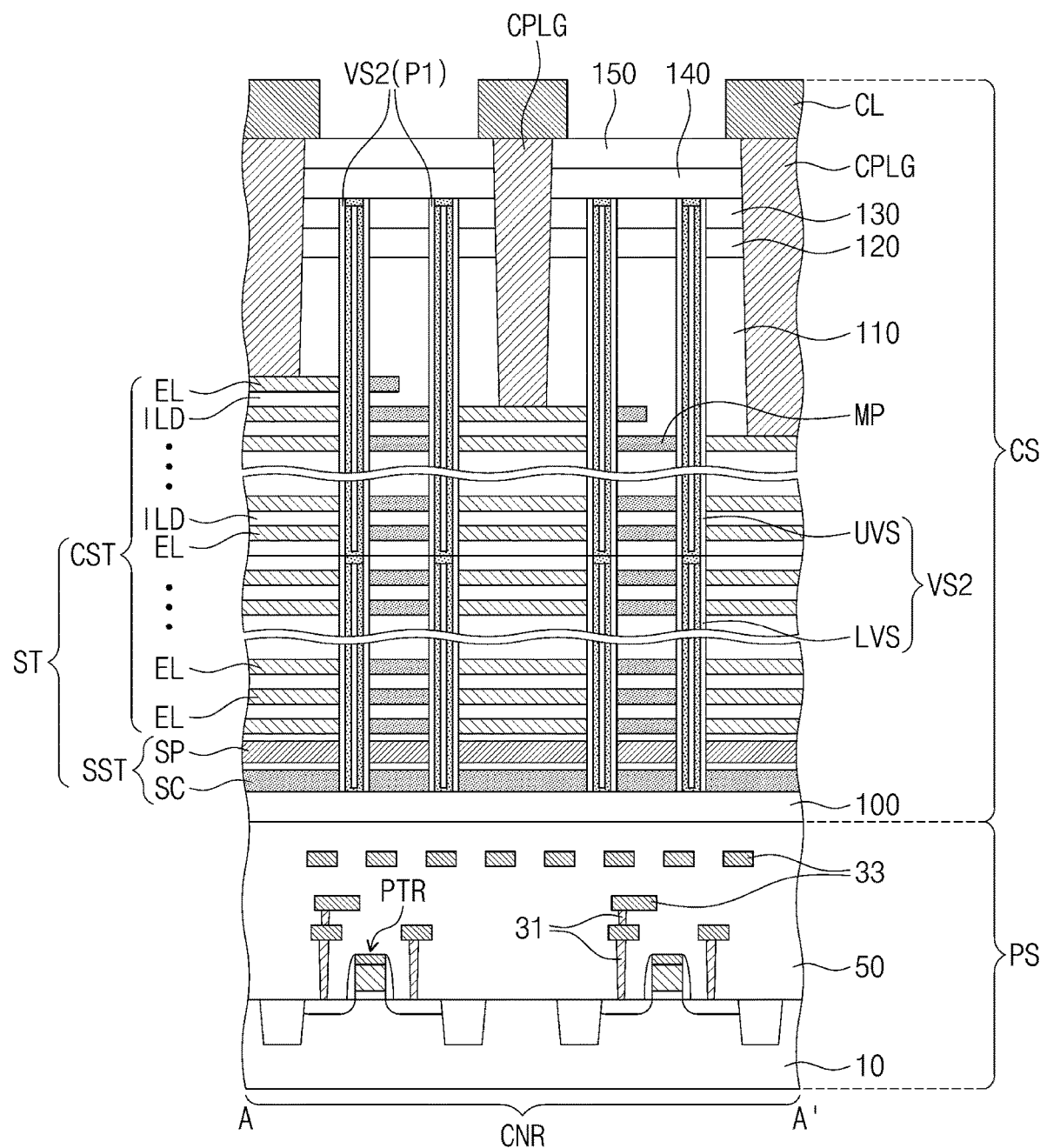

FIG. 6 illustrates an enlarged plan view of section P in FIG. 3, showing a three-dimensional semiconductor memory device according to some example embodiments. FIGS. 7 to 9 illustrates cross-sectional views taken along line A-A' of FIG. 6, showing a three-dimensional semiconductor memory device according to some example embodiments. For brevity of description, omission will be made in explaining technical features discussed previously with reference to FIGS. 3, 4A, 4B, and 5.

Referring to FIGS. 6 and 7, the electrodes EL of the electrode structure ST may include the pad portions ELp on the connection region CNR. When viewed in a plan view, the pad portions ELp of the electrodes EL may be disposed along the first direction D1. The dummy separation structures DSS may separate the pad portions ELp of the electrodes EL from each other in the second direction D2. The pad portions ELp of the electrodes EL may be located at different levels from each other in the third direction D3.

The second vertical structures VS2 may penetrate the electrode structure ST on the connection region CNR. The second vertical structures VS2 and the cell contact plugs CPLG may be alternately disposed along the first direction D1. For example, one cell contact plug CPLG may be disposed between the second vertical structures VS2 that are adjacent to each other in the first direction D1.

Each of the second vertical structures VS2 may include first parts P1 that are spaced apart from each other in the first direction D1, and may also include second parts P2 that are spaced apart from each other in the second direction D2 and connect the first parts P1 to each other. Each of the first parts P1 may include a line segment parallel to the second direction D2 and protrusion segments that protrude toward the cell contact plug CPLG from opposite ends of the line segment. For example, as illustrated in FIG. 6, each of the first parts P1 may have a linear line segment in the second direction D2 with a protrusion segment extending in the first direction D1 from each terminal end of the linear line segment in a direction oriented away from a corresponding second part P2, e.g., the protrusion segment may be aligned and colinear with the corresponding second part P1.

In each second vertical structure VS2, the first parts P1 may be mirror-symmetrical with each other. For example, as illustrated in FIG. 6, the first and second parts P1 and P2 may be continuous with each other to define a ladder-shape surrounding an opening in a center thereof, as viewed in a top view. For example, as illustrated in FIGS. 6 and 7, the first and second parts P1 and P2 may be continuous with each other to extend through the, e.g., entire, electrode structure ST in the third direction D3.

Each of the second vertical structures VS2 may commonly penetrate two pad portions ELp that neighbor each other along the first direction D1. The first parts P1 of the second vertical structure VS2 may correspondingly penetrate the pad portions ELp of the electrodes EL different from each other, e.g., the two first parts P1 of a same second vertical structure VS2 may penetrate two different pad portions ELp that are adjacent to each other along the first direction D1. The second parts P2 of the second vertical structure VS2 may penetrate sidewalls SW of the pad portions ELp different from each other, e.g., two second parts P2 of a same vertical structure VS2 may penetrate facing, e.g., and contacting, sidewalls SW (single line in FIG. 6) of pad portions ELp adjacent to each other along the first direction D1. Each of the second vertical structures VS2 may have a first width W1 in the second direction D2, and the first width W1 may be greater than a diameter W2 of the cell contact plug CPLG.

According to some example embodiments, mold patterns MP may be located at the same level as that of the electrodes EL, on the connection region CNR. The mold patterns MP may be surrounded by the first parts P1 of the second vertical structure VS2 and the second parts P2 of the second vertical structure VS2, e.g., the mold patterns MP may be positioned in the opening through the ladder-shaped first and second parts P1 and P2. The mold patterns MP may be formed of a dielectric material different from that of the dielectric layers ILD of the electrode structure ST. For example, the dielectric layers ILD of the electrode structure ST may include silicon oxide, and the mold patterns MP may include silicon nitride. The mold patterns MP may have their sidewalls in direct contact with the second vertical structure VS2.

The second vertical structures VS2 are illustrated to have their rectangular corners in plan views, but the shape of the corners may be changed depending on fabrication processes. For example, the corner may have a round shape or any shape with its curvature.

Referring to FIG. 8, the cell electrode structure CST may be configured such that $4n^{th}$ electrodes EL have their pad portions ELp disposed along the first direction D1 (where, n is a positive integer). In this case, $(4n-1)^{th}$, $(4n-2)^{th}$, and $(4n-3)^{th}$ electrodes EL may have their sidewalls aligned with that of the $4n^{th}$ electrode EL. The cell contact plugs CPLG may be coupled to the pad portions ELp of the $4n^{th}$ electrodes EL. Alternatively, the cell electrode structure CST may be configured such that even-numbered or odd-numbered electrodes EL have their pad portions ELp disposed along the first direction D1, and the cell contact plugs CPLG may be correspondingly coupled to the pad portions ELp of the even-numbered electrodes EL.

Referring to FIG. 9, the second vertical structures VS2 may include substantially the same structure and material as those of the first vertical structures VS1. For example, like the first vertical structures VS1 discussed above with reference to FIGS. 4A and 4B, each of the second vertical structures VS2 may include the lower vertical structure LVS and the upper vertical structure UVS. Further, like the first vertical structures VS1 discussed above with reference to FIG. 5, each of the lower and upper vertical structures LVS and UVS included in the second vertical structure VS2 may include the vertical semiconductor pattern VP and the data storage pattern DSP that surrounds a sidewall of the vertical semiconductor pattern VP.

Figure 10:
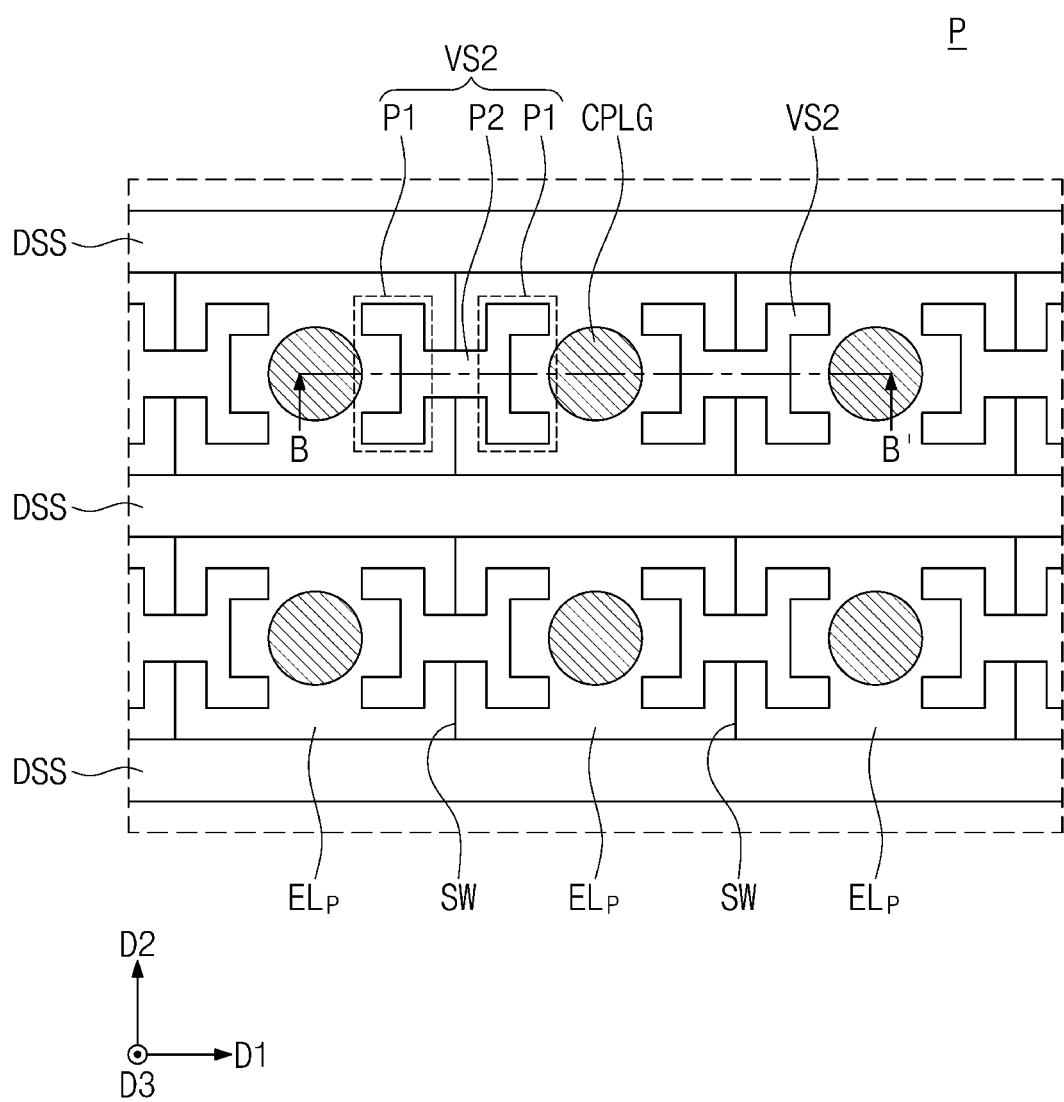
FIG. 10 illustrates an enlarged plan view of section P in FIG. 3, showing a three-dimensional semiconductor memory device according to some example embodiments.
Figure 11:
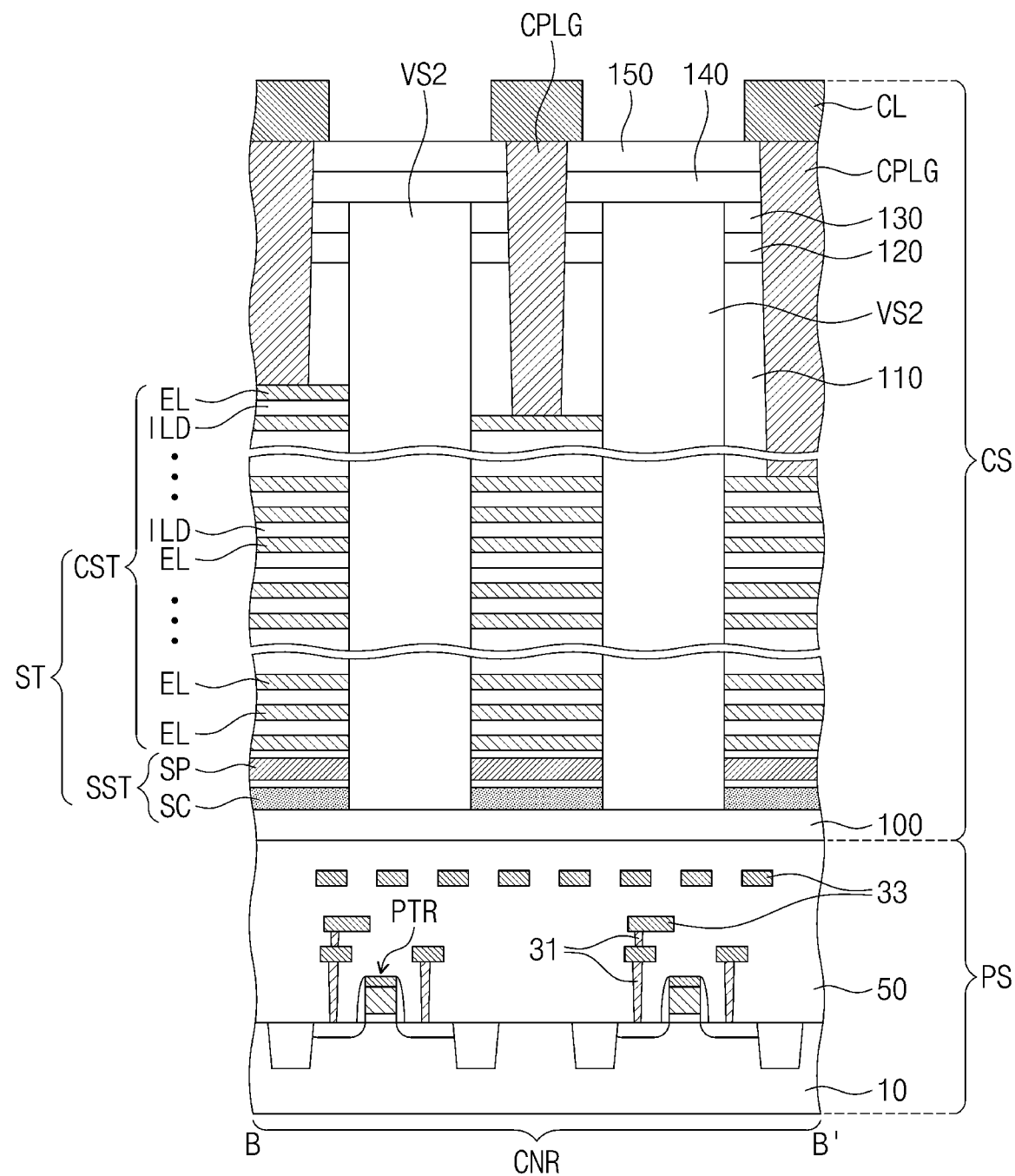
FIG. 11 illustrates a cross-sectional view taken along line B-B' of FIG. 10, showing a three-dimensional semiconductor memory device according to some example embodiments.

FIG. 10 illustrates an enlarged plan view of section P in FIG. 3, showing a three-dimensional semiconductor memory device according to some example embodiments. FIG. 11 illustrates a cross-sectional view taken along line B-B' of FIG. 10. For brevity of description, omission will be made in explaining technical features discussed previously with reference to FIGS. 6 to 9.

Referring to FIGS. 10 and 11, each of the second vertical structures VS2 may penetrate the pad portions ELp of two adjacent electrodes EL. Each of the second vertical structures VS2 may include first parts P1 spaced apart from each other in the first direction D1 and a second part P2 that connects the first parts P1 to each other, e.g., a single second part P2 may connect the two first parts P1 to each other. As discussed above, each of the first parts P1 may include a line segment and protrusion segments that protrude from opposite ends of the line segment. As discussed above, the second part P2 may penetrate the sidewall SW of the pad portion ELp. When viewed in the second direction D2, the second part P2 may have a width in the second direction D2 that is smaller than a width of each of the first parts P1 in the second direction D2.

FIGS. 12 to 19 illustrate enlarged plan views of section P in FIG. 3, showing a three-dimensional semiconductor memory device according to some example embodiments. For brevity of description, omission will be made in explaining technical features previously discussed with reference to FIGS. 6 to 9.

Figure 12:
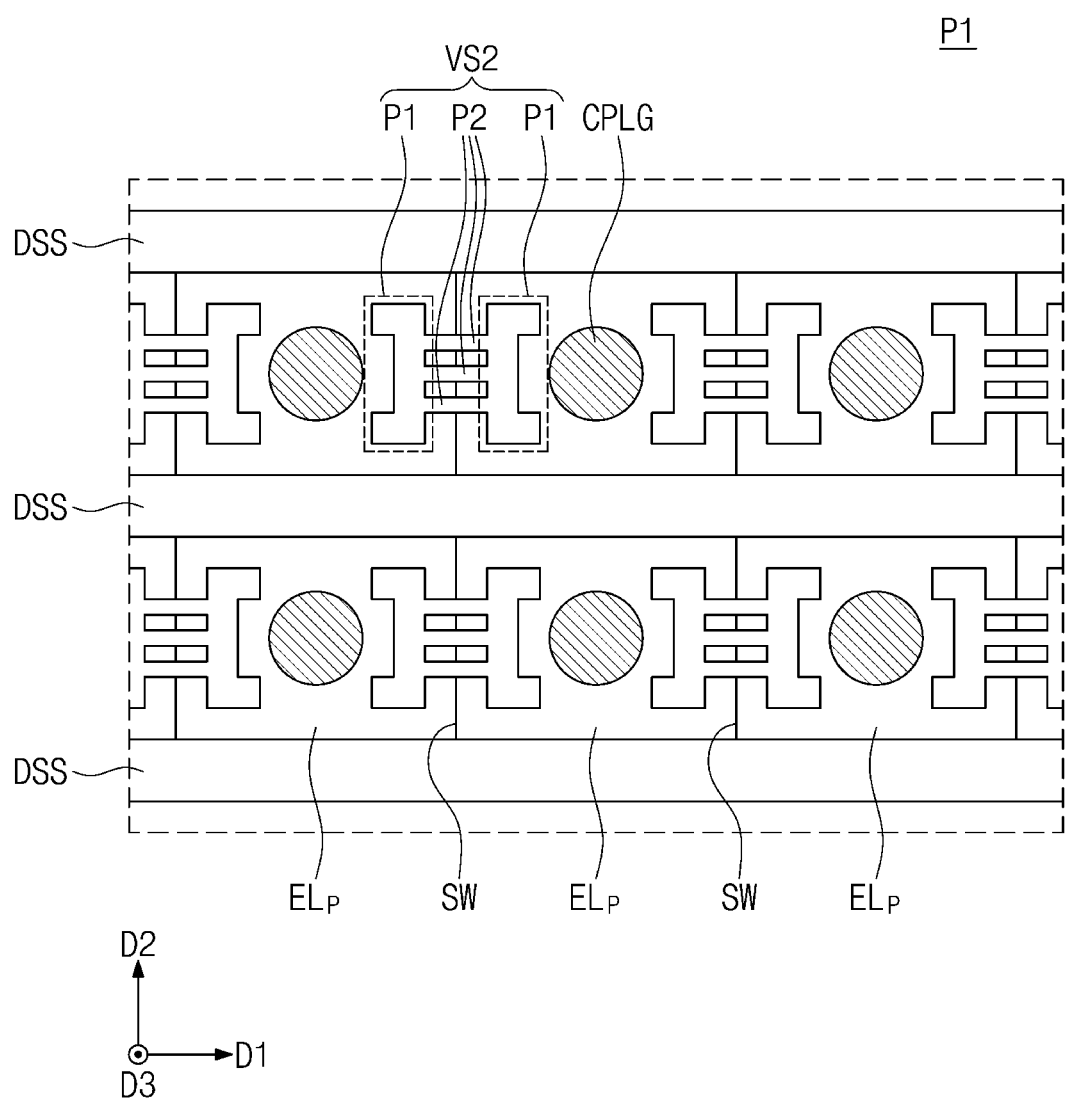
FIGS. 12 to 19 illustrate enlarged plan views of section P in FIG. 3, showing a three-dimensional semiconductor memory device according to some example embodiments.

Referring to FIG. 12, each of the second vertical structures VS2 may include first parts P1 spaced apart from each other in the first direction D1, and may also include second parts P2 that connect the first parts P1 to each other. The second parts P2, e.g., three second part P2, may be disposed spaced apart from each other in the second direction D2 between the first parts P1.

Figure 13:
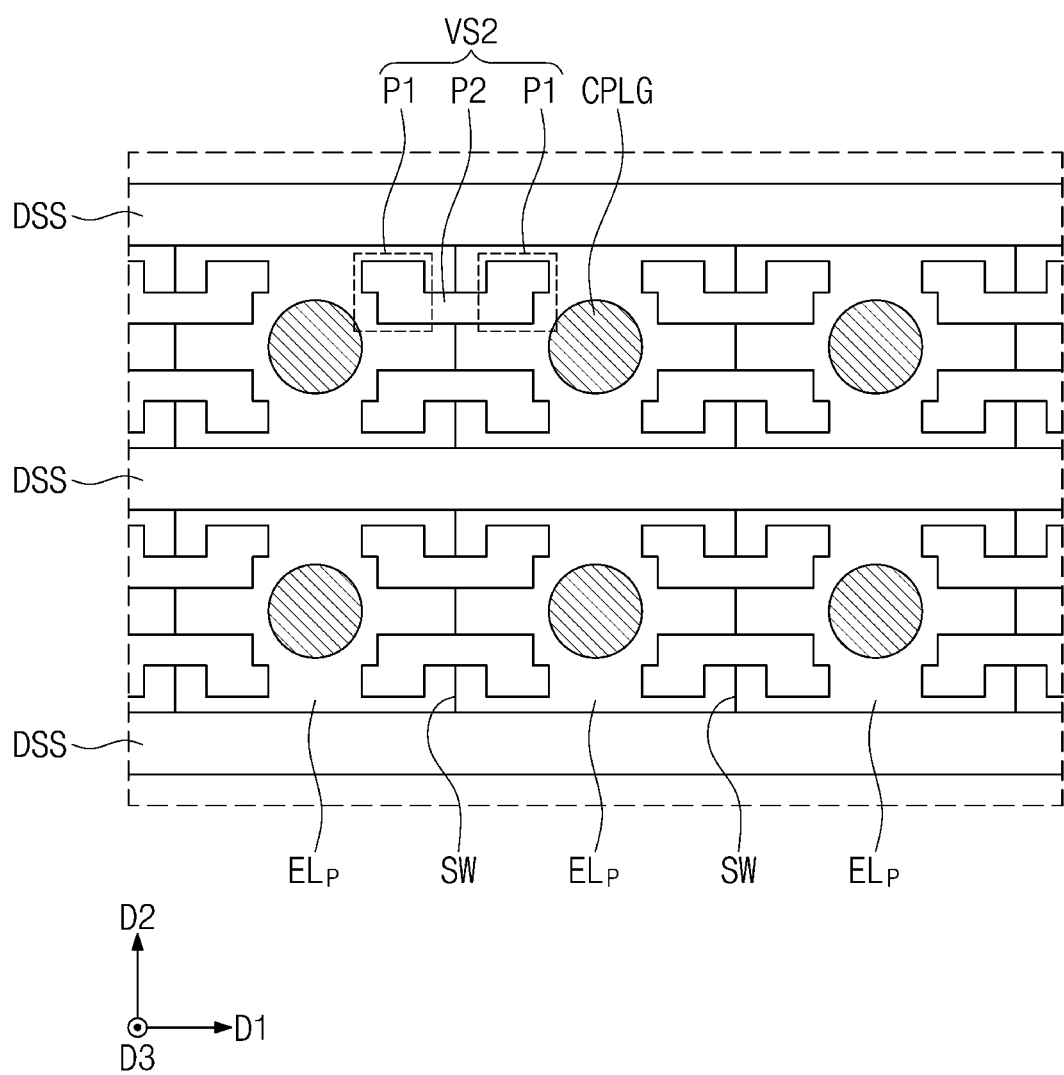

Referring to FIG. 13, a pair of second vertical structures VS2 may be disposed between two cell contact plugs CPLG that neighbor each other, e.g., the pair of second vertical structures VS2 may be adjacent to each other along the second direction D2 and may penetrate the same pair of neighboring contact plugs CPLG. As discussed above, each of the second vertical structures VS2 may include first parts P1 spaced apart from each other in the first direction D1, and may also include a second part P2 that connect the first parts P1 to each other. When viewed in a plan view, a pair of second vertical structures VS2 may be disposed symmetrically with each other, e.g., the pair of second vertical structures VS2 may be symmetrical with respect to a symmetry axis along the first direction D1. Each of the first parts P1 may include protrusion segments that protrude toward the cell contact plug CPLG.

Figure 14:
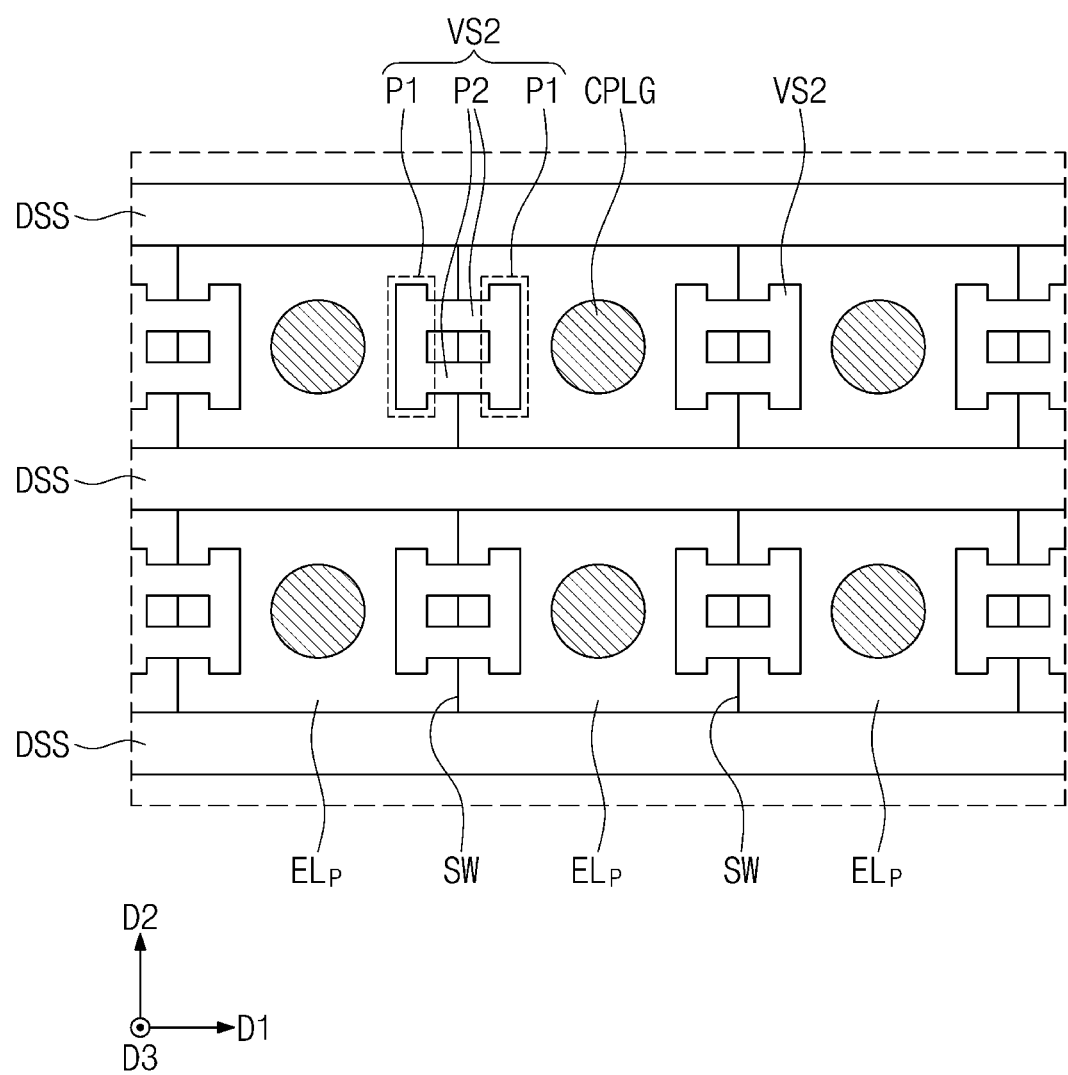

Referring to FIG. 14, each of the second vertical structures VS2 may include first parts P1 spaced apart from each other in the first direction D1, and may also include two second parts P2 that are spaced apart from each other in the second direction D2 and connect the first parts P1 to each other. The first parts P1 may have their linear shapes parallel to the second direction D2, and may protrude in the second direction D2 more than, e.g., beyond, the second parts P2.

Figure 15:
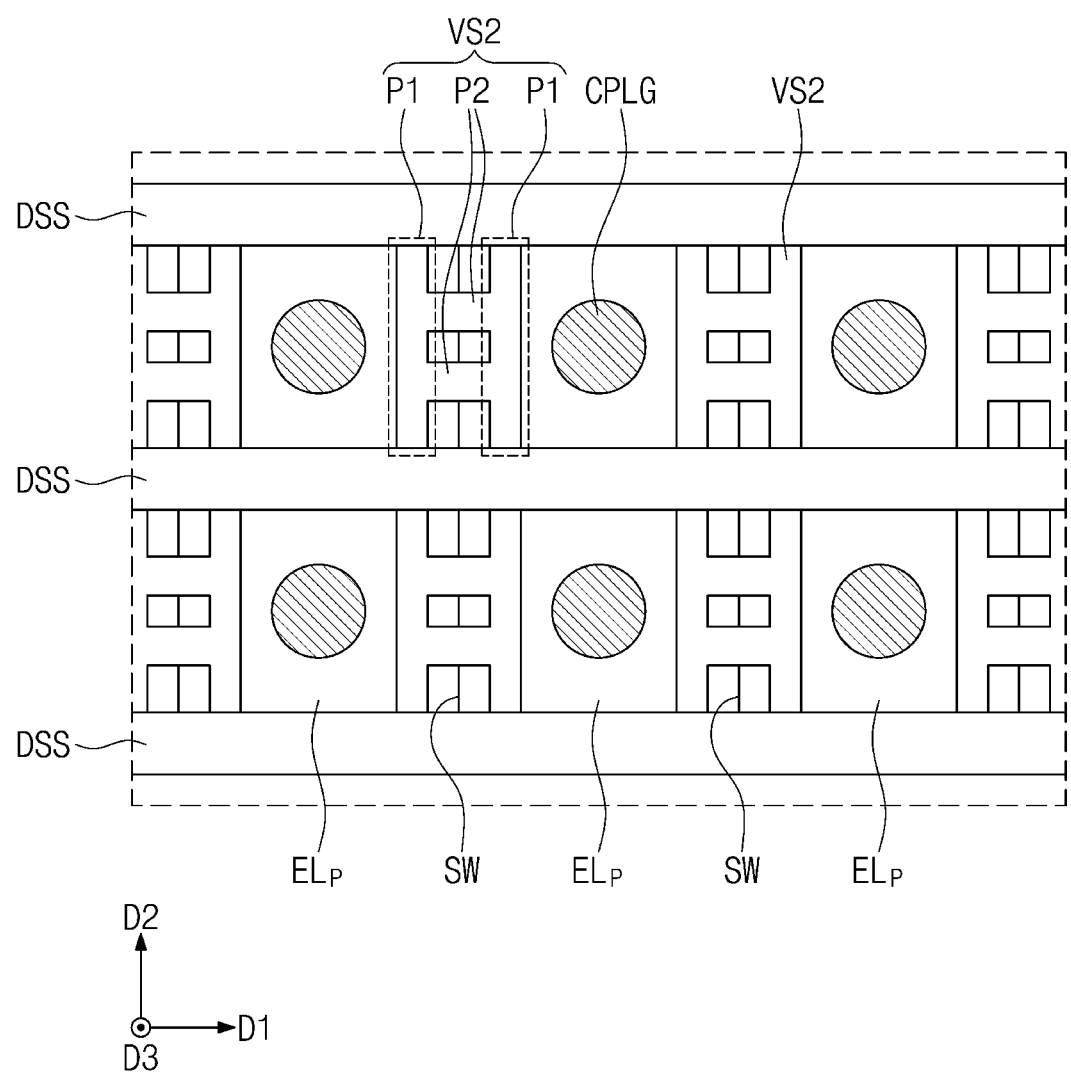

Referring to FIG. 15, each of the second vertical structures VS2 may include first parts P1 each having a linear shape similar to that of the embodiment shown in FIG. 14, and the first parts P1 may be in contact with the dummy separation structures DSS.

Figure 16:
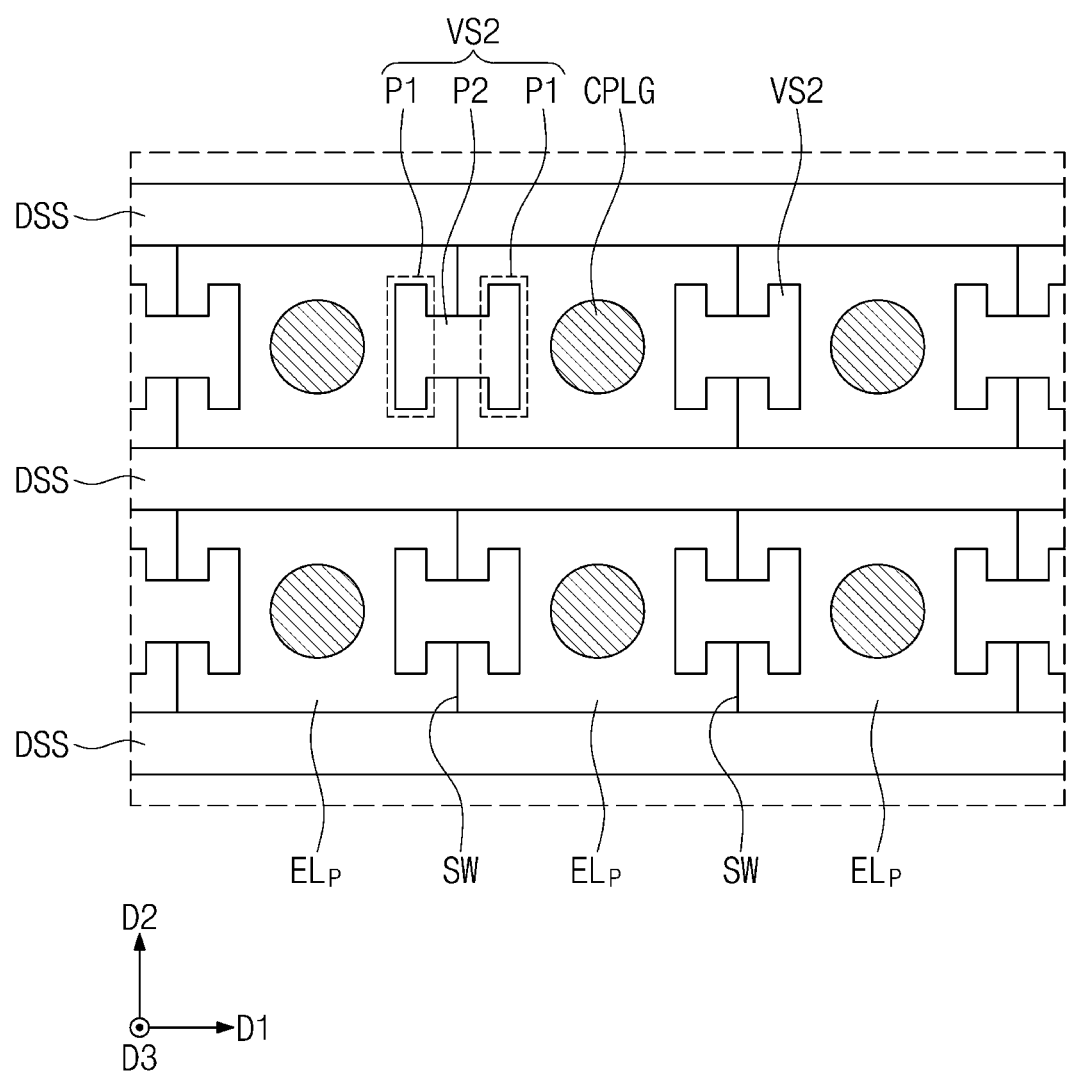

Referring to FIG. 16, similarly to the embodiment shown in FIG. 14, each of the second vertical structures VS2 may include line-shaped first parts P1 and a second part P2 that connects the first parts P1 to each other. When viewed in the second direction D2, the second part P2 may have a width less than those of the first parts P1.

Figure 17:
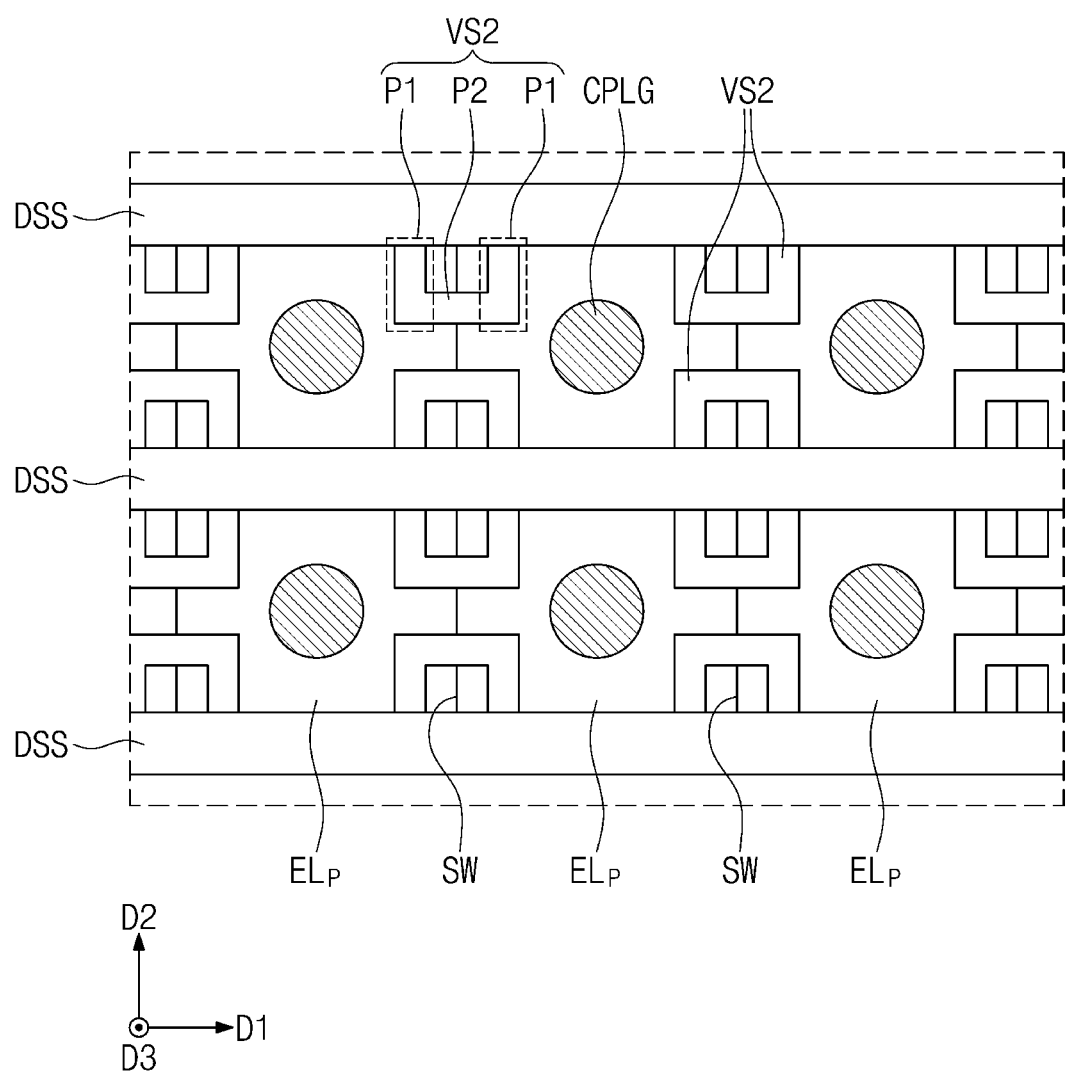

Referring to FIG. 17, a pair of second vertical structures VS2 may be disposed between two cell contact plugs CPLG that neighbor each other. As discussed above, each of the second vertical structures VS2 may include first parts P1 spaced apart from each other in the first direction D1, and may also include a second part P2 that connects the first parts P1 to each other, which first parts P1 are in contact with the dummy separation structures DSS.

Figure 18:
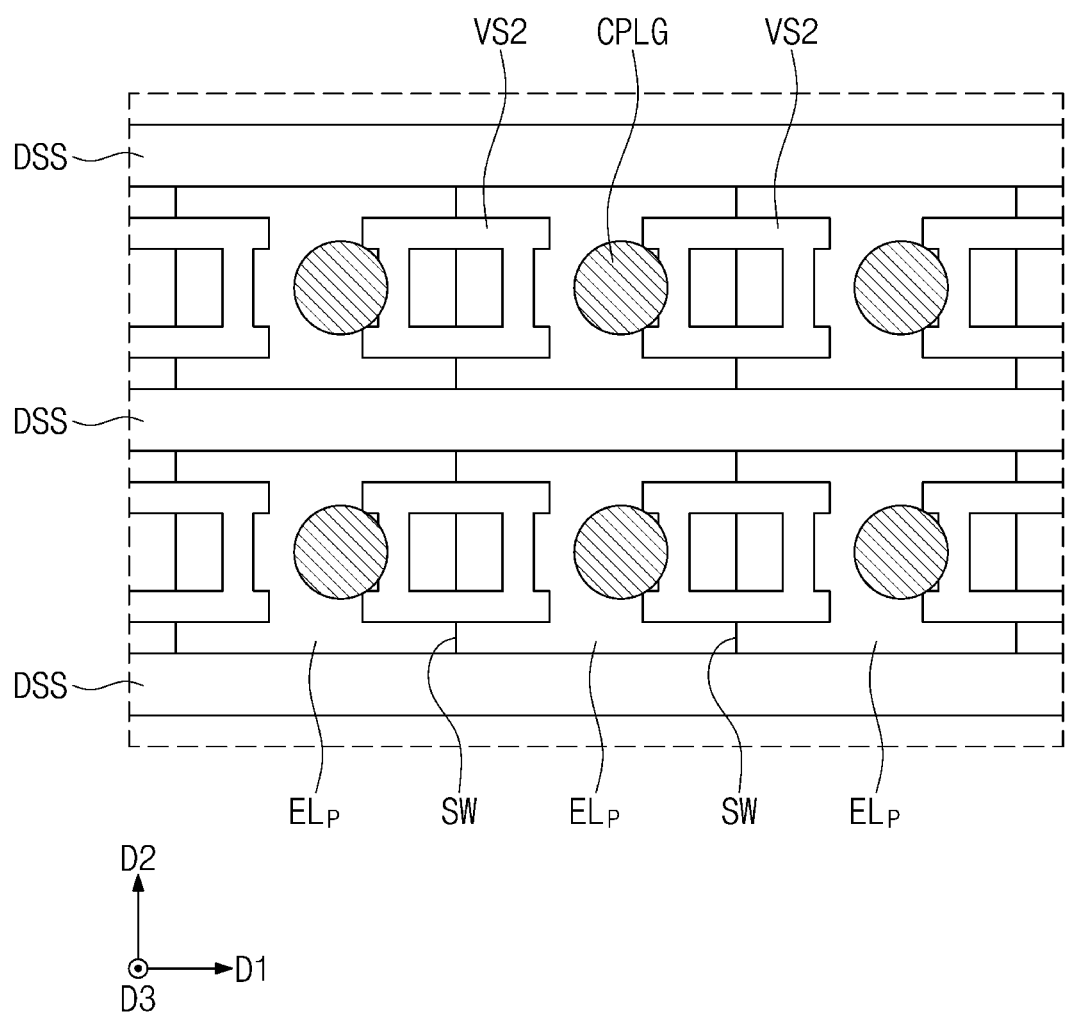

Referring to FIG. 18, as discussed above, each of the second vertical structures VS2 may penetrate two pad portions ELp that neighbor each other. Between two adjacent vertical structures VS2, each of the cell contact plugs CPLG may be coupled to the pad portion ELp of the electrode EL that corresponds to each of the cell contact plugs CPLG. When viewed in a plan view, each cell contact plug CPLG may be disposed to be offset from a center of the pad portion ELp, and may be in contact with the second vertical structure VS2 adjacent to each cell contact plug CPLG.

Figure 19:
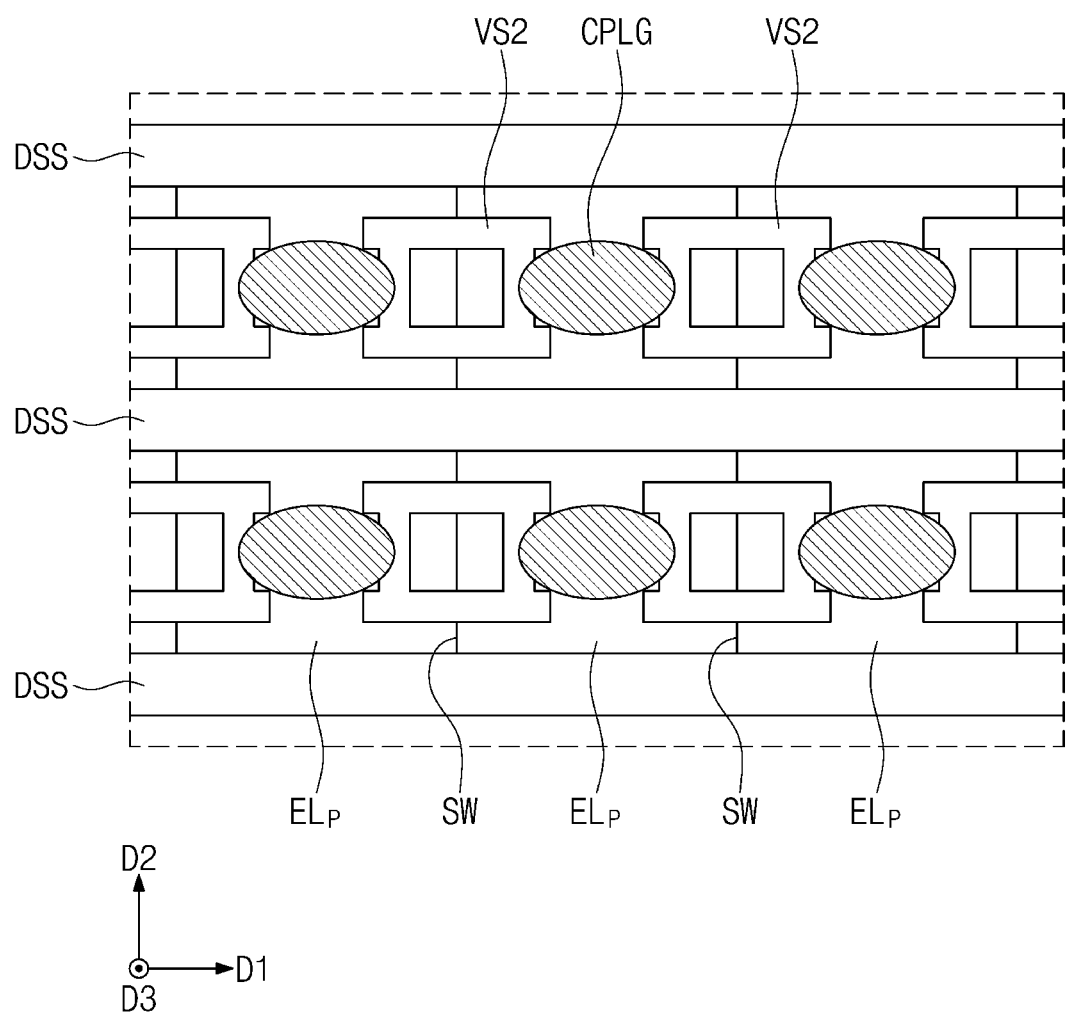

Referring to FIG. 19, the cell contact plug CPLG may have a diameter greater than a distance between adjacent second vertical structures VS2. Each cell contact plug CPLG may be in contact with two second vertical structures VS2 adjacent to each cell contact plug CPLG. In addition, as shown, the cell contact plug CPLG may have an oval top surface.

By way of summation and review, embodiments provide a three-dimensional semiconductor memory device with enhanced reliability and electrical characteristics. That is, according to example embodiments, each of vertical structures on a connection region may include first parts and a second part that connects the first parts to each other, such that it may be possible to prevent collapse or connection of adjacent vertical holes when the vertical holes are formed to receive second vertical structures. Therefore, a three-dimensional semiconductor memory device may improve in reliability and electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional semiconductor memory device, comprising:
a substrate including a cell array region and a connection region;
an electrode structure including electrodes vertically stacked on the substrate, the electrodes including respective pad portions on the connection region, and the pad portions of the electrodes being stacked in a staircase structure along a first direction;
contact plugs coupled to the pad portions of the electrodes, respectively;
first vertical structures penetrating the electrode structure on the cell array region; and
second vertical structures penetrating the electrode structure on the connection region, each of the second vertical structures including:
a dielectric pillar having a sidewall in direct contact with the electrodes,
at least two first parts spaced apart from each other in the first direction, and
second parts spaced apart from each other in a second direction that intersects the first direction, the second parts connecting the at least two first parts to each other to define a single second vertical structure that is between adjacent contact plugs in the first direction, and the first and second directions being parallel to a top surface of the substrate,
wherein each of the pad portions of the electrodes has a first width in the second direction, and
wherein the single second vertical structure has a second width less than the first width in the second direction,
wherein each of the contact plugs is between directly adjacent single second vertical structures.

2. The device as claimed in claim 1, wherein, in each of the second vertical structures, the second parts penetrate a sidewall of at least one of the pad portions.

3. The device as claimed in claim 1, wherein, in each of the second vertical structures, each of the first parts includes a line segment and a plurality of protrusion segments that protrude from opposite ends of the line segment, each of the first parts horizontally overlapping an entire side of an adjacent one of the contact plugs and is longer than the adjacent one of the contact plugs.

4. The device as claimed in claim 3, wherein, in each of the second vertical structures, the first parts are mirror-symmetrical with each other.

5. The device as claimed in claim 1, wherein:
the pad portions of the electrodes are arranged along the first direction, and
the single second vertical structure has a total first width in the second direction that is greater than a diameter of a corresponding one of the contact plugs.

6. The device as claimed in claim 1, further comprising mold patterns on the connection region, the mold patterns being at a same level as that of the electrodes, respectively, and the mold patterns being surrounded by the first and second parts of the second vertical structures.

7. The device as claimed in claim 1, wherein top surfaces of the second vertical structures are at a level different from a level of top surfaces of the first vertical structures.

8. The device as claimed in claim 1, wherein each of the second vertical structures includes a bottom surface in contact with the substrate.

9. The device as claimed in claim 1, wherein the contact plugs are in contact with portions of the second vertical structures.

10. The device as claimed in claim 1, wherein the pad portions of the electrodes are arranged along the first direction, a distance between the second vertical structures adjacent to each other in the first direction being less than a diameter of each of the contact plugs.

11. The device as claimed in claim 1, wherein each of the first vertical structures includes:
a lower vertical structure that penetrates a lower portion of the electrode structure; and
an upper vertical structure that penetrates an upper portion of the electrode structure.

12. The device as claimed in claim 1, wherein each of the first vertical structures includes:
a vertical semiconductor pattern; and
a data storage pattern between the vertical semiconductor pattern and the electrodes.

13. The device as claimed in claim 12, further comprising a source pattern between the electrode structure and the substrate, the source pattern being in contact with at least a portion of each of the vertical semiconductor patterns of the first vertical structures.

14. A three-dimensional semiconductor memory device, comprising:
a substrate including a cell array region and a connection region;
an electrode structure including electrodes vertically stacked on the substrate, the electrodes including pad portions on the connection region, respectively, and the pad portions of the electrodes being stacked in a staircase structure along a first direction;
contact plugs coupled to the pad portions of the electrodes, respectively;
first vertical structures penetrating the electrode structure on the cell array region; and
second vertical structures penetrating the electrode structure on the connection region and spaced apart from each other, each of the second vertical structures including:
a dielectric pillar having a sidewall in direct contact with the electrodes,
at least two first parts spaced apart from each other in the first direction; and
at least one second part connecting the at least two first parts to each other to define a single second vertical structure that is between adjacent contact plugs in the first direction, the at least one second part penetrating sidewalls of the pad portions, respectively,
wherein each of the second vertical structures penetrates adjacent ones of the pad portions in the first direction,
wherein each of the pad portions of the electrodes has a first width in a second direction, and
wherein the single second vertical structure has a second width less than the first width in the second direction,
wherein each of the contact plugs is between directly adjacent single second vertical structures.

15. The device as claimed in claim 14, wherein:
each of the first vertical structures includes a vertical semiconductor pattern and a data storage pattern between the vertical semiconductor pattern and the electrodes, and
each of the second vertical structures includes a bottom surface in contact with the substrate.

16. The device as claimed in claim 14, further comprising:
a peripheral circuit structure below the substrate, the peripheral circuit structure including peripheral circuits integrated on a semiconductor layer; and
a connection structure that penetrates a portion of the electrode structure on the connection region, the connection structure connecting the electrode structure to the peripheral circuit structure, and the connection structure including:
a through dielectric pattern that penetrates the electrode structure on the connection region, and
through plugs in the through dielectric pattern and connected to the peripheral circuit structure.

17. The device as claimed in claim 16, wherein top surfaces of the second vertical structures are at a substantially same level as that of top surfaces of the through plugs.

18. A three-dimensional semiconductor memory device, comprising:
a peripheral circuit structure that includes peripheral circuits integrated on a semiconductor substrate;
a horizontal layer on the peripheral circuit structure, the horizontal layer including a cell array region and a connection region;
an electrode structure including electrodes vertically stacked on the horizontal layer, the electrodes including pad portions on the connection region, respectively, and the pad portions of the electrodes being stacked in a staircase structure in a first direction;
first vertical structures penetrating the electrode structure on the cell array region;
second vertical structures penetrating the electrode structure on the connection region;
cell contact plugs coupled to the pad portions of the electrodes, respectively; and
a connection structure connecting the electrode structure to the peripheral circuit structure, the connection structure including a through dielectric pattern that penetrates the electrode structure on the connection region and through plugs in the through dielectric pattern, the through plugs being connected to the peripheral circuit structure,
wherein each of the second vertical structures includes:
a dielectric pillar having a sidewall in direct contact with the electrodes,
first parts between adjacent cell contact plugs in the first direction, the first parts being spaced apart from each other and from the adjacent cell contact plugs in the first direction, and
at least one second part between the adjacent cell contact plugs in the first direction that connects all the first parts between the adjacent cell contact plugs in the first direction to each other, all the first and second parts being continuous with each other and entirely between the adjacent cell contact plugs in the first direction,
wherein each of the pad portions of the electrodes has a first width in a second direction, and
wherein each of the second vertical structures has a second width less than the first width in the second direction,
wherein each of the cell contact plugs is between directly adjacent second vertical structures.

19. The device as claimed in claim 18, wherein the second vertical structures have top surfaces at a substantially same level as that of top surfaces of the through plugs.

20. The device as claimed in claim 18, wherein each of the first vertical structures includes:
a lower vertical structure that penetrates a lower portion of the electrode structure; and
an upper vertical structure that penetrates an upper portion of the electrode structure.

* * * * *